US012593540B2

(12) United States Patent
Liang et al.

(10) Patent No.: US 12,593,540 B2
(45) Date of Patent: Mar. 31, 2026

(54) SEMICONDUCTOR LIGHT SOURCE AND DRIVING CIRCUIT THEREOF

(71) Applicant: VERTILITE CO., LTD., Jiangsu (CN)

(72) Inventors: Dong Liang, Jiangsu (CN); Cheng Zhang, Jiangsu (CN)

(73) Assignee: VERTILITE CO., LTD., Jiangsu (CN)

( * ) Notice: Subject to any disclaimer, the term of this patent is extended or adjusted under 35 U.S.C. 154(b) by 582 days.

(21) Appl. No.: 18/020,654

(22) PCT Filed: Oct. 14, 2021

(86) PCT No.: PCT/CN2021/123693
§ 371 (c)(1),
(2) Date: Feb. 10, 2023

(87) PCT Pub. No.: WO2022/213573
PCT Pub. Date: Oct. 13, 2022

(65) Prior Publication Data
US 2023/0307582 A1 Sep. 28, 2023

Related U.S. Application Data

(60) Provisional application No. 63/171,066, filed on Apr. 5, 2021.

(30) Foreign Application Priority Data

Jul. 28, 2021 (CN) .......................... 202110857072.8

(51) Int. Cl.
*H10H 20/831* (2025.01)
*H01S 5/183* (2006.01)
(Continued)

(52) U.S. Cl.
CPC ....... *H10H 20/8312* (2025.01); *H01S 5/4031* (2013.01); *H10H 20/062* (2025.01);
(Continued)

(58) Field of Classification Search
CPC .. H10H 20/8312; H10H 20/062; H10H 20/81; H10H 20/8142; H10H 29/10;
(Continued)

(56) References Cited

U.S. PATENT DOCUMENTS 6,040,590 A 3/2000 OBrien et al.
8,492,782 B2 * 7/2013 Lee .................... H10H 20/8314
257/79

(Continued)

FOREIGN PATENT DOCUMENTS

CN 1802054 A 7/2006
CN 104465856 A 3/2015
(Continued)

OTHER PUBLICATIONS

European Search Report issued by the European Patent Office in connection with International Application No. 21935791, dated Nov. 9, 2024.

(Continued)

*Primary Examiner* — Mark W Tornow
(74) *Attorney, Agent, or Firm* — Carter, DeLuca & Farrell LLP; George Likourezos

(57) ABSTRACT

Provided are a semiconductor light source and a driver circuit thereof. The semiconductor light source includes an active layer, a first semiconductor layer, a second semiconductor layer, a first electrode, a second electrode, and a third electrode. The first semiconductor layer and the second semiconductor layer are located on two opposite sides of the active layer. The first electrode is in ohmic contact with the first semiconductor layer. The third electrode is in ohmic contact with the second semiconductor layer. A first dielectric layer is disposed between the first electrode and the second electrode. The first semiconductor layer is a p-type semiconductor layer, and the second semiconductor layer is (Continued)

100 an n-type semiconductor layer. Alternatively, the first semiconductor layer is an n-type semiconductor layer, and the second semiconductor layer is a p-type semiconductor layer.

20 Claims, 14 Drawing Sheets

(51) Int. Cl.

| | | |
|---|---|---|
| *H01S 5/40* | (2006.01) | |
| *H10H 20/00* | (2025.01) | |
| *H10H 20/81* | (2025.01) | |
| *H10H 20/814* | (2025.01) | |

(52) U.S. Cl.
CPC ........ *H10H 20/81* (2025.01); *H10H 20/8142* (2025.01); *H01S 5/183* (2013.01)

(58) Field of Classification Search
CPC .. H10H 20/835; H10H 20/862; H10H 20/042; H10H 20/83; H10H 29/20; H01S 5/4031; H01S 5/183; H01S 5/04253; H01S 5/04254; H01S 5/04257; H01S 5/04256; H01S 5/06226; H01S 5/18305; H01S 5/18311; H01S 5/0428; H01S 5/423; H01L 25/167; H01L 25/18
See application file for complete search history.

(56) References Cited

U.S. PATENT DOCUMENTS

| | | | | |
|---|---|---|---|---|
| 2009/0242910 A1* | 10/2009 | Murofushi | ............. | H05B 45/54 |
| | | | | 257/E33.012 |
| 2010/0078656 A1* | 4/2010 | Seo | ...................... | H10H 20/856 |
| | | | | 257/E33.056 |
| 2010/0096652 A1* | 4/2010 | Choi | .................. | H10H 20/0137 |
| | | | | 257/E33.068 |
| 2012/0292631 A1* | 11/2012 | Katsuno | .............. | H10H 20/819 |
| | | | | 257/E33.025 |
| 2017/0325303 A1 | 11/2017 | Huang et al. | | |
| 2020/0136348 A1 | 4/2020 | Enzmann et al. | | |
| 2020/0161282 A1 | 5/2020 | Kang et al. | | |

FOREIGN PATENT DOCUMENTS

| | | | |
|---|---|---|---|
| CN | 106784173 A | 5/2017 | |
| CN | 110574246 A | 12/2019 | |
| CN | 111799654 A | 10/2020 | |
| CN | 112447785 A | 3/2021 | |
| CN | 113410192 A | 9/2021 | |
| JP | 2007073585 A | 3/2007 | |
| JP | 2012209529 A | 10/2012 | |
| JP | 2014217126 A | 11/2014 | |
| JP | 2018201009 A | 12/2018 | |
| WO | 2006006312 A1 | 1/2006 | |
| WO | 2009102032 A1 | 8/2009 | |

OTHER PUBLICATIONS

Japanese Office Action issued by the Japanese Patent Office in connection with Internationhal Application No. 2023-510464, dated Nov. 8, 2023.

Japanese Office Action issued by the Japanese Patent Office in connection with International Application No. 2023-510464, dated Feb. 21, 2024.

International Search Report issued in corresponding International Application No. PCT/CN2021/123693 dated Jan. 12, 2022, pp. 1-3, English Translation.

\* cited by examiner

100

100

100

100

31
41
32

32
41
31

100

100

100

100

100

100

100

100

SEMICONDUCTOR LIGHT SOURCE AND DRIVING CIRCUIT THEREOF

CROSS-REFERENCE TO RELATED APPLICATION(S)

The is a national stage application filed under 37 U.S.C. 371 based on International Patent Application No. PCT/CN2021/123693, filed Oct. 14, 2021, which claims priority to the United States Provisional Patent Application No. 63/171,066 filed with the United States Patent and Trademark Office (USPTO) on Apr. 5, 2021, and the Chinese Patent Application No. 202110857072.8 filed with the China National Intellectual Property Administration (CNIPA) on Jul. 28, 2021, the disclosures of which are incorporated herein by reference in their entireties.

TECHNICAL FIELD

Embodiments of the present application relate to the field of semiconductor light source technology, for example, a semiconductor light source and a driver circuit thereof.

BACKGROUND

The time of flight (ToF) is a technology that obtains information including the position and shape of an object by measuring a time delay between the emitted light and the received light reflected from the object. Therefore, the technology is widely used in fields including 3D image acquisition and 3D sensing.

The method of using direct time of flight (dToF) to drive a semiconductor light source has advantages including short pulse, large current, and high power; therefore, the method is widely used in applications including light detection and ranging (LiDAR).

A conventional dToF driver circuit uses a capacitor charging and discharging method to drive a semiconductor light source to generate optical pulses. A capacitor and a charging resistor are disposed on the dToF driver circuit. Moreover, the semiconductor light source is driven through the manner of charging and discharging the capacitor. In the dToF driver circuit in the related art, the capacitor is electrically connected to the semiconductor light source through submount wiring, and a series inductance exists between the capacitor and the semiconductor light source. Because optical pulse width is proportional to the 0.5 power of the series inductance, and optical power is inversely proportional to optical pulse width, the larger the series inductance, the wider the optical pulse width and the lower the optical power. Therefore, a reduction of the series inductance is the key to improving the performance of the dToF driver circuit.

To reduce the series inductance, multiple dToF driver circuits use optimized semiconductor light source packaging methods, such as using a low-inductance submount and increasing the number of wires for a semiconductor light source. However, such methods for reducing the series inductance have limited effects. Even with the adoption of optimized submounts and packaging manners, the series inductance that can be implemented is still high, which is usually above 0.5 nH, restricting the performance of dToF driver circuits.

SUMMARY

Embodiments of the present application provide a semiconductor light source and a driver circuit thereof. The semiconductor light source is integrated with a capacitor. Therefore, the series inductance between the semiconductor light source and the capacitor is reduced, thereby implementing relatively short optical pulse width and relatively large optical power, simplifying the design of the dToF driver circuit, and improving the performance of the dToF driver circuit.

In a first aspect, embodiments of the present application provide a semiconductor light source. The semiconductor light source includes an active layer, a first semiconductor layer, a second semiconductor layer, a first electrode, a second electrode, and a third electrode.

The first semiconductor layer and the second semiconductor layer are located on two opposite sides of the active layer.

The first electrode is in ohmic contact with the first semiconductor layer. The third electrode is in ohmic contact with the second semiconductor layer. A first dielectric layer is disposed between the first electrode and the second electrode.

The first semiconductor layer is a p-type semiconductor layer, and the second semiconductor layer is an n-type semiconductor layer. Alternatively, the first semiconductor layer is an n-type semiconductor layer, and the second semiconductor layer is a p-type semiconductor layer.

In a second aspect, embodiments of the present application provide a driver circuit of a semiconductor light source. The driver circuit is configured to drive the semiconductor light source provided in the preceding aspect. The driver circuit includes a first voltage source, a second voltage source, a charging resistor, a field-effect transistor, and a control signal source. The voltage of the first voltage source is greater than the voltage of the second voltage source.

A first pole of the field-effect transistor is electrically connected to the third electrode of the semiconductor light source. A second pole of the field-effect transistor is electrically connected to the second electrode of the semiconductor light source through a first node. The gate of the field-effect transistor is electrically connected to the control signal source. The first pole is the drain of the field-effect transistor, and the second pole is the source of the field-effect transistor. Alternatively, the first pole is the source of the field-effect transistor, and the second pole is the drain of the field-effect transistor.

The first voltage source is electrically connected with a positive electrode in the semiconductor light source. The second voltage source is electrically connected with a negative electrode in the semiconductor light source. The positive electrode is an electrode that is in ohmic contact with a p-type semiconductor layer in the semiconductor light source. The negative electrode is an electrode that is in ohmic contact with an n-type semiconductor layer in the semiconductor light source.

The charging resistor is connected in series in a loop composed of the first voltage source, the first electrode, the second electrode, and the second voltage source.

REFERENCE LIST

Figure 1:
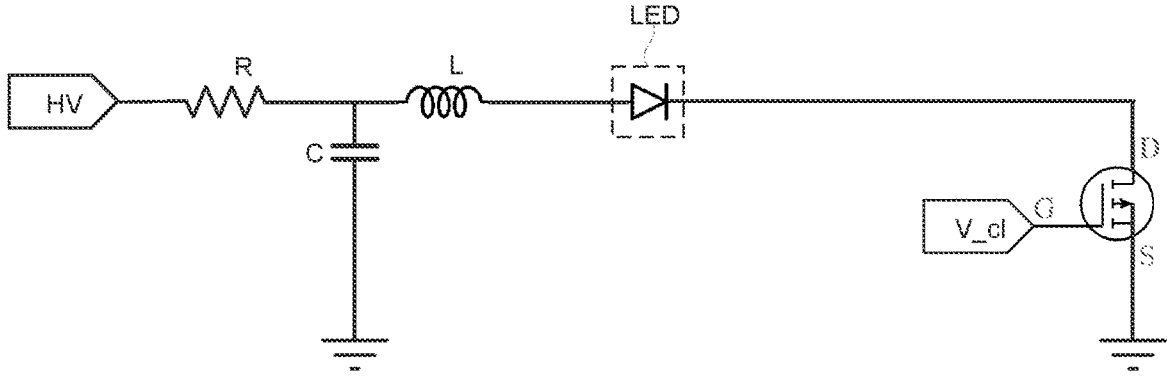
FIG. 1 is a diagram of a driver circuit of a semiconductor light source in the related art.

100 semiconductor light source 10 active layer 21 first semiconductor layer 22 second semiconductor layer 31 first electrode 32 second electrode 33 third electrode 41 first dielectric layer 411 first sub-dielectric layer 412 second sub-dielectric layer 42 second dielectric layer 421 first dielectric portion 422 second dielectric portion 423 third dielectric portion 424 fourth dielectric portion 425 fifth dielectric portion 426 sixth dielectric portion 427 seventh dielectric portion 50 substrate 60 annular electrode 70 oxidation layer 80 passivation layer 90 transparent electrode 101 emitter

DETAILED DESCRIPTION

Hereinafter the present application will be described in detail in conjunction with the drawings and embodiments. It is to be understood that the embodiments described herein are intended to illustrate and not to limit the present application. Additionally, it is to be noted that for ease of description, only a part, not all, of the structures related to the present application are illustrated in the drawings. Moreover, the shape and size of each structure in the drawings do not reflect the actual scale, and the purpose is merely to schematically illustrate the content of the present application. "First" and "second" hereinafter have no special meaning and are merely for ease of distinguishing.

Optionally, a semiconductor light source provided in embodiments of the present application may be, for example, a vertical-cavity surface-emitting laser (VCSEL), a light-emitting diode (LED), or an edge-emitting laser diode (EELD). The type of the semiconductor light source is not specially limited in embodiments of the present application.

FIG. 1 is a diagram of a driver circuit of a semiconductor light source in the related art. An example in which the semiconductor light source is an LED is taken for illustration. As shown in FIG. 1, the traditional LED usually includes two electrodes, a positive electrode and a negative electrode. The driver circuit may be a dToF driver circuiting including a capacitor C and a charging resistor R. The capacitor C is connected in parallel with the LED. Through charging and discharging the capacitor, the LED is driven to generate optical pulses. It is to be understood that the capacitor C and the LED are each disposed on a circuit submount. The capacitor C is electrically connected to the LED by wiring. Therefore, a series inductance L (from, for example, wire bonding, the submount, and circuit board wiring) exists between the capacitor C and the LED. As mentioned above, the series inductance may affect optical pulse width and optical power. The larger the series inductance, the larger the optical pulse width, the lower the optical power, and the poorer the performance of the dToF driver circuit.

Embodiments of the present application provide a semiconductor light source. The semiconductor light source includes an active layer, a first semiconductor layer, a second semiconductor layer, a first electrode, a second electrode, and a third electrode. The first semiconductor layer and the second semiconductor layer are located on two opposite sides of the active layer. The first electrode is in ohmic contact with the first semiconductor layer. The third electrode is in ohmic contact with the second semiconductor layer. A first dielectric layer is disposed between the first electrode and the second electrode. The first semiconductor layer is a p-type semiconductor layer, and the second semiconductor layer is an n-type semiconductor layer. Alternatively, the first semiconductor layer is an n-type semiconductor layer, and the second semiconductor layer is a p-type semiconductor layer.

With the adoption of the preceding technical solutions, the first electrode, the first dielectric layer, and the second electrode that are in the semiconductor light source constitute a capacitor. Therefore, the capacitor can be integrated in the semiconductor light source so that the capacitor is very close to the semiconductor light source and has good electrical contact with the semiconductor light source, making the series inductance between the capacitor and the semiconductor light source as small as possible, thereby implementing relatively short optical pulse width and relatively large optical power, and improving the performance of a dToF driver circuit. Moreover, the preceding solutions help omit the capacitor in an original dToF driver circuit and simplify circuit design.

Figure 2:
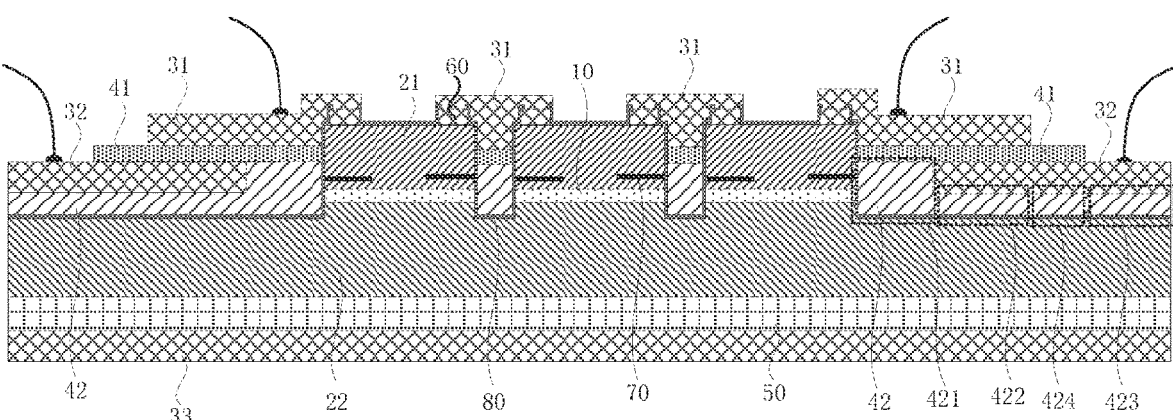
FIG. 2 is a section view illustrating the structure of a semiconductor light source according to embodiments of the present application.
Figure 3:
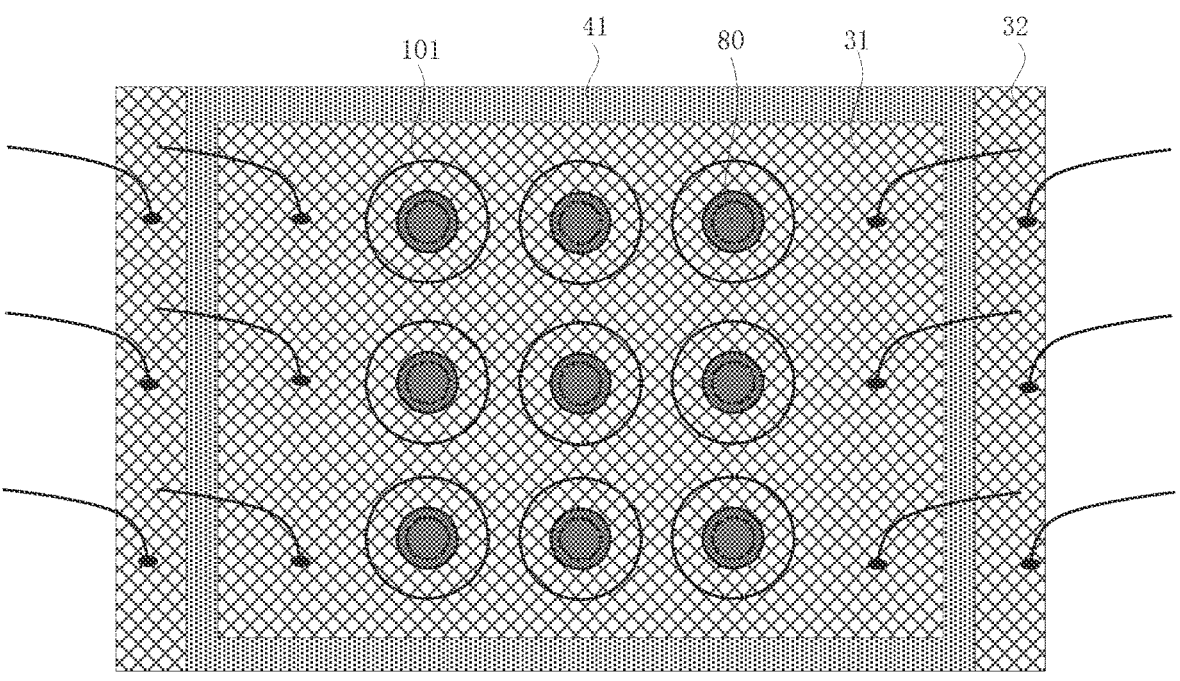
FIG. 3 is a top view illustrating the structure of the semiconductor light source corresponding to FIG. 2.

FIG. 2 is a section view illustrating the structure of a semiconductor light source according to embodiments of the present application. FIG. 3 is a top view illustrating the structure of the semiconductor light source corresponding to FIG. 2. Referring to FIG. 2, the semiconductor light source 100 includes an active layer 10, a first semiconductor layer 21, a second semiconductor layer 22, a first electrode 31, a second electrode 32, and a third electrode 33. The first semiconductor layer 21 and the second semiconductor layer 22 are located on two opposite sides of the active layer 10. The first electrode 31 is in ohmic contact with the first semiconductor layer 21. The third electrode 33 is in ohmic contact with the second semiconductor layer 22. A first dielectric layer 41 is disposed between the first electrode 31 and the second electrode 32. The first semiconductor layer 21 is a p-type semiconductor layer, and the second semiconductor layer 22 is an n-type semiconductor layer. Alternatively, the first semiconductor layer 21 is an n-type semiconductor layer, and the second semiconductor layer 22 is a p-type semiconductor layer.

As shown in FIG. 2, the second semiconductor layer 22, the active layer 10, and the first semiconductor layer 21 are stacked in sequence on a substrate 50. The second semiconductor layer 22 may be an n-type semiconductor layer or a p-type semiconductor layer. In other words, the semiconductor layer close to the substrate 50 may be an n-type semiconductor layer or a p-type semiconductor layer. Correspondingly, the semiconductor layer away from the substrate 50 may be a p-type semiconductor layer or an n-type semiconductor layer. This is not limited in embodiments of the present application.

The first electrode 31 and the third electrode 33 each may be a positive electrode of the semiconductor light source 100 or a negative electrode of the semiconductor light source 100. It is to be understood that most carriers of a p-type semiconductor layer are holes, so the electrode in ohmic contact with the p-type semiconductor layer is the positive electrode; moreover, most carriers of an n-type semiconductor layer are electrons, so the electrode in ohmic contact with the n-type semiconductor layer is the negative electrode. The polarity of the first electrode 31 and the polarity of the third electrode 33 may be determined according to the doping type of the first semiconductor layer 21 and the doping type of the second semiconductor layer 22. Exemplarily, when the first semiconductor layer 21 is a p-type semiconductor layer and the second semiconductor layer 22 is an n-type semiconductor layer, the first electrode 31 is the positive electrode and the third electrode 33 is the negative electrode. When the first semiconductor layer 21 is an n-type semiconductor layer and the second semiconductor layer 22 is a p-type semiconductor layer, then the first electrode 31 is the negative electrode and the third electrode 33 is the positive electrode.

Exemplarily, the first dielectric layer 41 is disposed between the first electrode 31 and the second electrode 32. Therefore, the capacitor may be constituted in the overlapping portion of the orthographic projection of the first electrode 31 on the plane where the active layer 10 is located, the orthographic projection of the first dielectric layer 41 on the plane where the active layer 10 is located, and the orthographic projection of the second electrode 32 on the plane where the active layer 10 is located. The first electrode 31 and the second electrode 32 are two capacitor plates of the capacitor. The capacitor and the semiconductor light source share the first electrode 31. In this case, the arrangement in which the second electrode 32 is added and the first dielectric layer 42 is disposed between the first electrode 31 and the second electrode 32 enables the capacitor to be integrated in the semiconductor light source, shortening the distance between the semiconductor light source and the capacitor and guaranteeing good electrical contact between the semiconductor light source and the capacitor. Therefore, the series inductance between the semiconductor light source and the capacitor is reduced, thereby implementing relatively short optical pulse width and relatively large optical power and improving the performance of the dToF driver circuit. Moreover, since the semiconductor light source is integrated with the capacitor, the solutions in embodiments of the present application also help omit the capacitor in the original dToF driver circuit and simplify the design of the dToF driver circuit.

It is to be understood that the size of the capacitor is related to factors including the facing area of the first electrode 31 and the second electrode 32, the relative distance between the first electrode 31 and the second electrode 32, and the permittivity of the first dielectric layer 41. The size of the capacitor may be designed by those skilled in the art according to actual situations and is not further explained here. Optionally, the material of the first dielectric layer 41 includes, and is not limited to, at least one of air, silicon dioxide, silicon nitride, aluminum oxide, titanium dioxide, tantalum oxide, hafnium oxide, or a polymer. Exemplarily, the first electrode, the second electrode, and the third electrode may be deposited from metal materials (including but not limited to, for example, gold and copper) with good conductivity.

It is to be noted that an example in which the semiconductor light source has one active layer (active region) is taken in FIG. 2 and the subsequent drawings. The structure is not limited. In other embodiments, optionally, in the direction perpendicular to the plane where the active layer is located, the semiconductor light source 100 includes a plurality of active layers 10. Two adjacent active layers 10 are connected through a tunnel junction to form a multi-junction semiconductor light source, improving the power of the semiconductor light source.

According to the semiconductor light source provided in embodiments of the present application, the arrangement in which the second electrode is added and the first dielectric layer is disposed between the first electrode and the second electrode enables the first electrode, the first dielectric layer, and the second electrode to form the capacitor. Therefore, the capacitor is integrated in the semiconductor light source, shortening the distance between the semiconductor light source and the capacitor and guaranteeing good electrical contact between the semiconductor light source and the capacitor. Therefore, the series inductance between the semiconductor light source and the capacitor is reduced, thereby implementing relatively short optical pulse width and relatively large optical power, simplifying the design of the dToF driver circuit, and improving the performance of the dToF driver circuit.

Two different solutions are provided hereinafter so that the first electrode 31, the first dielectric layer 41, and the second electrode 32 form the capacitor.

Figure 4:
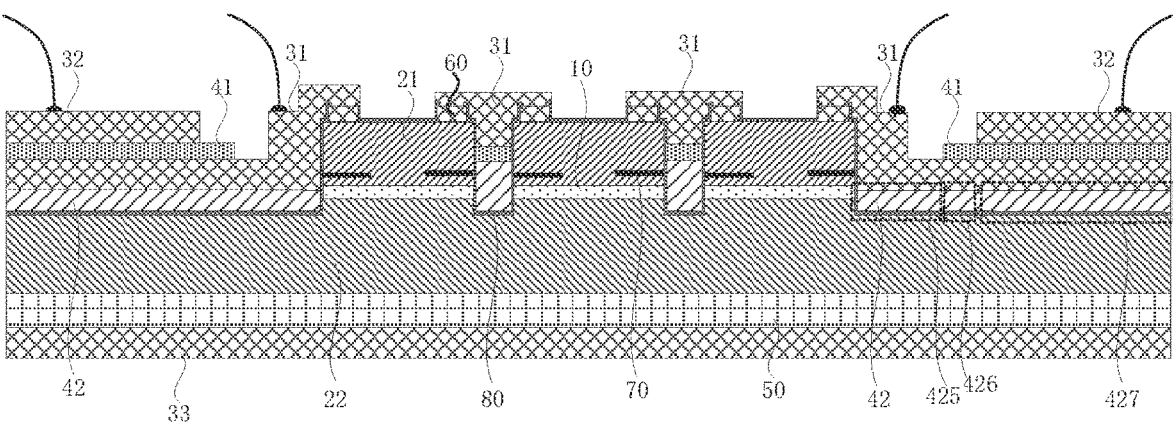
FIG. 4 is a section view illustrating the structure of another semiconductor light source according to embodiments of the present application.

In a feasible solution, referring to FIG. 2, optionally, the orthographic projection of the first electrode 31 on the plane where the active layer 10 is located overlaps the orthographic projection of the second electrode 32 on the plane where the active layer 10 is located. With this arrangement, the first electrode 31, the first dielectric layer 41, and second electrode 32 form the capacitor in the direction parallel to the epitaxial growth direction of the semiconductor light source. In this case, optionally, the second electrode 32 is located on a side of the first electrode 31 facing the second semiconductor layer 22 (as shown in FIG. 2). Alternatively, as shown in FIG. 4, FIG. 4 is a section view illustrating the structure of another semiconductor light source according to embodiments of the present application. Optionally, the second electrode 32 is located on a side of the first electrode 31 facing away from the second semiconductor layer 22.

Figure 5:
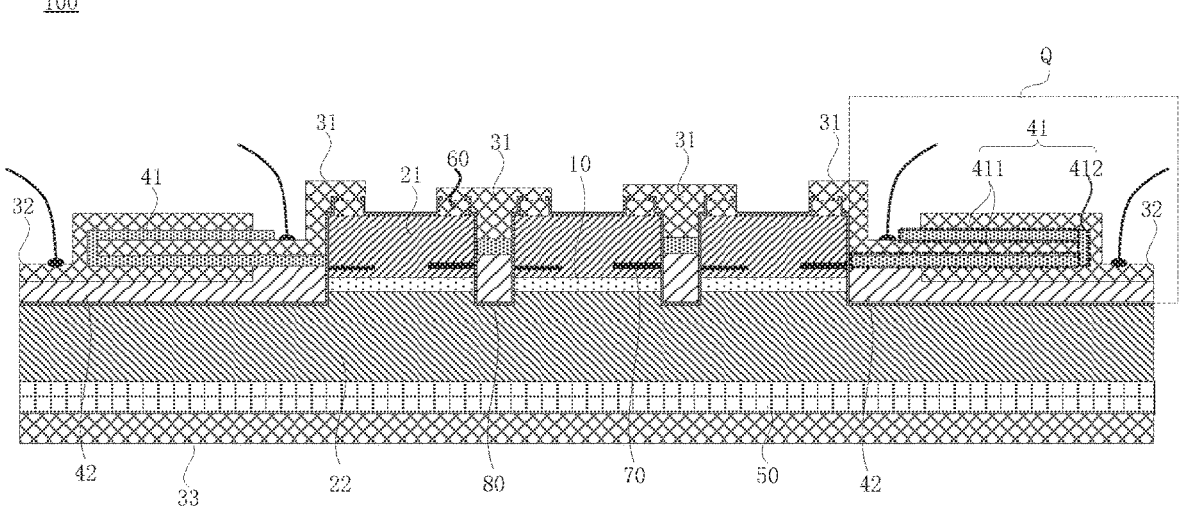
FIG. 5 is a section view illustrating the structure of another semiconductor light source according to embodiments of the present application.

FIG. 5 is a section view illustrating the structure of another semiconductor light source according to embodiments of the present application. Referring to FIG. 5, optionally, the first dielectric layer 41 includes at least two first sub-dielectric layers 411 and at least one second sub-dielectric layer 412. A first sub-dielectric layer 411 is parallel to the plane where the active layer 10 is located. A second sub-dielectric layer 412 is located on the same side of two adjacent first sub-dielectric layers 411 and connects with the two adjacent first sub-dielectric layers 411. The first electrode 31 and the second electrode 32 are located on two opposite sides of the same first sub-dielectric layer 411 and located on two opposite sides of the same second sub-dielectric layer 412.

Exemplarily, as shown in FIG. 5, the first dielectric layer 41 includes two first sub-dielectric layers 411 and one second sub-dielectric layer 412. The first sub-dielectric layers 411 are parallel to the plane where the active layer 10 is located. The second sub-dielectric layer 412 is located on the same side of the two adjacent first sub-dielectric layers 411 and connects with the two adjacent first sub-dielectric layers 411. With this arrangement, the equivalent area of the capacitor is increased, and the effect of improving the capacity of the capacitor is achieved.

Figure 6:
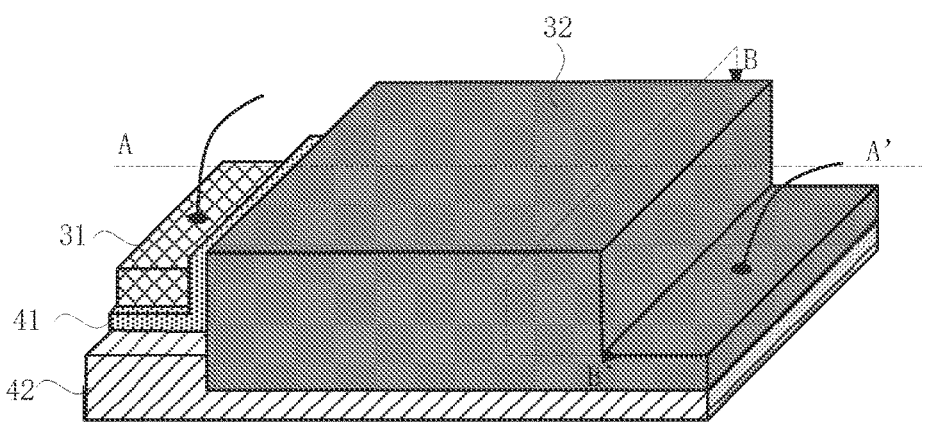
FIG. 6 is a three-dimensional diagram illustrating the partial structure of the semiconductor light source corresponding to region Q of FIG. 5.
Figure 7:
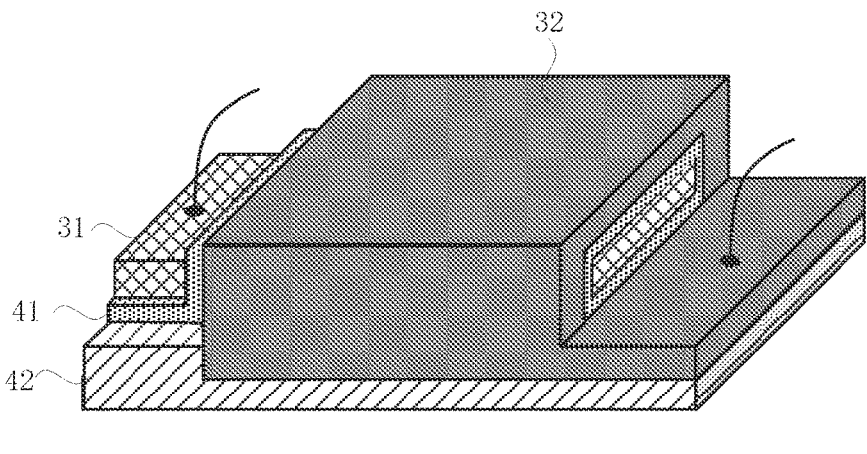
FIG. 7 is a diagram illustrating the internal structure of the semiconductor light source taken along BB' of FIG. 6.

Exemplarily, FIG. 6 is a three-dimensional diagram illustrating the partial structure of the semiconductor light source corresponding to region Q of FIG. 5. The structure of region Q of FIG. 5 may be a section structure taken along AA' of FIG. 6. For ease of distinguishing, in FIG. 6, the second electrode 32 adopts another filling manner. FIG. 7 is a diagram illustrating the internal structure of the semiconductor light source taken along BB' of FIG. 6. With combined reference to FIGS. 5 and 7, it can be seen that the second electrode 32 wraps the first dielectric layer 41, and the first dielectric layer 41 wraps the first electrode 31. Therefore, the equivalent area of the capacitor is increased, and the capacity of the capacitor is improved.

It is to be noted that the structure shown in FIG. 5 is only an example and is not limited thereto. In other embodiments, the first dielectric layer 41 may include more first sub-dielectric layers 411 and more second sub-dielectric layers 412. It is to be understood that the number of second sub-dielectric layers 412 is one less than the number of first sub-dielectric layers 411. Moreover, the second sub-dielectric layer 412 connecting the $(i-1)^{th}$ first sub-dielectric layer 411 to the $i^{th}$ first sub-dielectric layer 411 and the second sub-dielectric layer 412 connecting the $i^{th}$ first sub-dielectric layer 411 to the $(i+1)^{th}$ first sub-dielectric layer 411 are disposed on two opposite sides, where i is an integer greater than or equal to 2.

Figure 8:
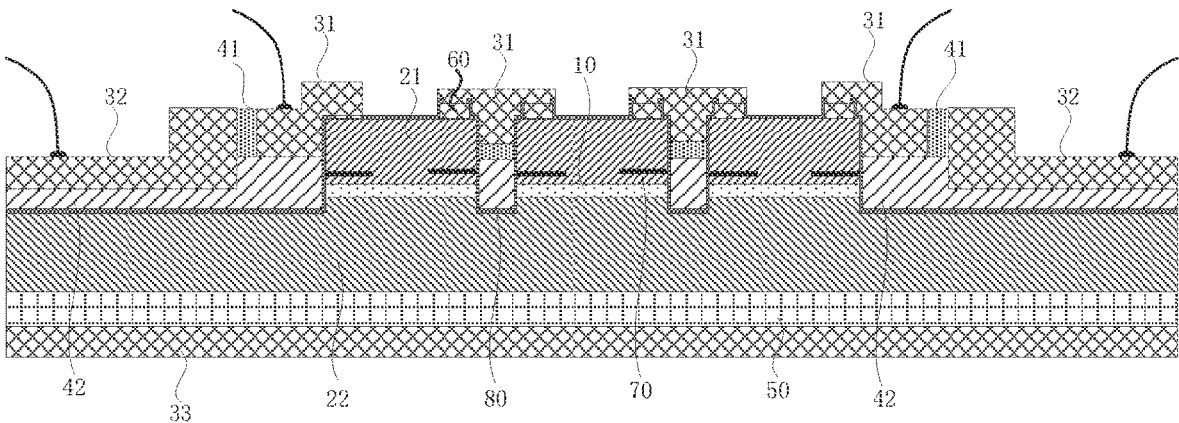
FIG. 8 is a section view illustrating the structure of another semiconductor light source according to embodiments of the present application.

In another feasible solution, FIG. 8 is a section view illustrating the structure of another semiconductor light source according to embodiments of the present application. Referring to FIG. 8, optionally, the orthographic projection of the first electrode 31 on the plane where the active layer 10 is located does not overlap the orthographic projection of the second electrode 32 on the plane where the active layer 10 is located, and the orthographic projection of the first electrode 31 on a first plane overlaps the orthographic projection of the second electrode 32 on the first plane. The first plane intersects the plane where the active layer 10 is located.

The first plane may refer to a plane that intersects the section shown in FIG. 8 and the plane where the active layer 10 is located. Referring to FIG. 8, in embodiments of the present application, it can be seen that the orthographic projection of the first electrode 31 on the plane where the active layer 10 is located does not overlap the orthographic projection of the second electrode 32 on the plane where the active layer 10 is located, and the orthographic projection of the first electrode 31 on the first plane overlaps the orthographic projection of the second electrode 32 on the first plane. With this arrangement, the first electrode 31, the first dielectric layer 41, and the second electrode 32 form the capacitor in the direction perpendicular to the epitaxial growth direction of the semiconductor light source.

Figure 9:
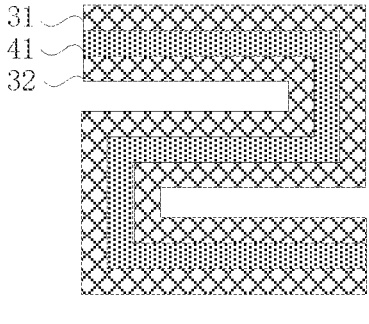
FIG. 9 is a top view illustrating a partial structure of the semiconductor light source corresponding to FIG. 8.
Figure 10:
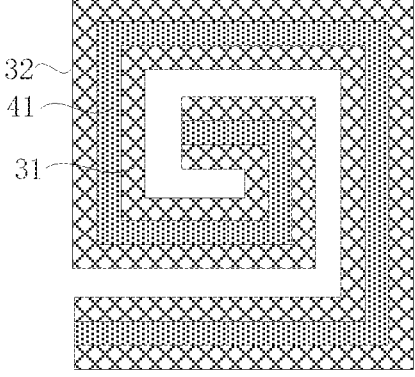
FIG. 10 is a top view illustrating another partial structure of the semiconductor light source corresponding to FIG. 8.

FIG. 9 is a top view illustrating a partial structure of the semiconductor light source corresponding to FIG. 8. FIG. 10 is a top view illustrating another partial structure of the semiconductor light source corresponding to FIG. 8. Two top-view structures of the first electrode 31, the first dielectric layer 41, and the second electrode 32 are illustrated. Referring to FIGS. 9 and 10, optionally, the shape of the projection of the first dielectric layer 41 on the plane where the active layer 10 is located includes a zigzag shape (as shown in FIG. 9) or a spiral shape (as shown in FIG. 10). The first electrode 31 and the second electrode 32 are located on two opposite sides of the first dielectric layer 41. As above, the first electrode 31, the first dielectric layer 41, and the second electrode 32 are intertwined by using the manners in FIGS. 9 and 10. Therefore, the equivalent area of the capacitor is increased, and the capacity of the capacitor is improved.

Referring to FIG. 2, when the second electrode 32 is located on a side of the first electrode 31 facing the second semiconductor layer 22, optionally, a second dielectric layer 42 is disposed on a side of the second electrode 32 facing away from the first electrode 31.

In this embodiment, the arrangement in which the second electrode 32 is disposed on a side of the first electrode 31 facing the second semiconductor layer 22 avoids increasing the entire thickness of the semiconductor light source 100. Exemplarily, the arrangement in which the second dielectric layer 42 is disposed on a side of the second electrode 32 facing away from the first electrode 31 guarantees that the second electrode 32 is insulated from structures such as the first semiconductor layer 21, the active layer 10, and the second semiconductor layer 22, thereby guaranteeing the normal operation of the semiconductor light source 100. Additionally, the second dielectric layer 42 may also be used for elevating the first dielectric layer 41 and the second electrode 32 so as to achieve effects such as improving the yield of the semiconductor light source and improving the electrical connection between the semiconductor light source and an external driver circuit, which is described in detail hereinafter in combination with embodiments and is not repeated here.

Of course, the structure is not limited. Referring to FIG. 4, as mentioned above, when the orthographic projection of the first electrode 31 on the plane where the active layer 10 is located overlaps the orthographic projection of the second electrode 32 on the plane where the active layer 10 is located, the second electrode 32 may also be located on a side of the first electrode 31 facing away from the second semiconductor layer 22. In this case, optionally, the second dielectric layer 42 is disposed on a side of the first electrode 31 facing away from the second electrode 32. Similarly, the arrangement in which the second dielectric layer 42 is disposed on a side of the first electrode 31 facing away from the second electrode 32 guarantees that the first electrode 31 is insulated from the second semiconductor layer 22, thereby guaranteeing the normal operation of the semiconductor light source 100. Additionally, to make the thickness of the semiconductor light source 100 relatively small, part of the active layer 10 and part of the first semiconductor layer 21 that correspond to the first electrode 31 may be etched away with reference to FIG. 4.

The structure of a semiconductor light source is described in detail hereinafter in combination with different types of semiconductor light sources.

In an optional solution, the semiconductor light source may be, for example, a vertical-cavity surface-emitting laser (VCSEL). Referring to FIGS. 2 and 3, optionally, the semiconductor light source 100 is a vertical-cavity surface-emitting laser. The first semiconductor layer 21 includes a first distributed Bragg reflector. The second semiconductor layer 22 includes a second distributed Bragg reflector.

For the VCSEL, the first semiconductor layer 21 and the second semiconductor layer 22 may be distributed Bragg reflectors (DBRs). The first semiconductor layer 21 may refer to an upper distributed Bragg reflector. The second semiconductor layer 22 may refer to a lower distributed Bragg reflector. The upper distributed Bragg reflector, the active layer 10, and the lower distributed Bragg reflector form a resonant cavity to increase the energy of laser. Exemplarily, the upper distributed Bragg reflector may be p-type DBR, and the lower distributed Bragg reflector may be n-type DBR. Alternatively, the upper distributed Bragg reflector may be n-type DBR, and the lower distributed Bragg reflector may be p-type DBR. This is not limited in embodiments of the present application.

When the semiconductor light source is a VCSEL, the first semiconductor layer 21 may include at least two first sub-semiconductor layers (not shown in the drawings) with different materials, and the second semiconductor layer 22 may include at least two second sub-semiconductor layers (not shown in the drawings) with different materials. For example, the first semiconductor layer 21 and the second semiconductor layer 22 may each be formed by periodically stacking multiple pairs of materials with high refractive index and materials with low refractive index. The material systems and structures thereof are not limited here.

Optionally, as shown in FIGS. 2 and 3, the semiconductor light source may include a plurality of emitters 101 arranged in an array. A passivation layer 80 and a dielectric layer are disposed between adjacent emitters 101. The dielectric layer includes at least the first dielectric layer 41.

Exemplarily, in FIG. 2, adjacent emitters 101 are separated from each other by the passivation layer 80, the first dielectric layer 41, and the second dielectric layer 42. Exemplarily, in the process, to form the emitters 101, the first semiconductor layer 21, the active layer 10, and the second semiconductor layer 22 need to be etched to form a trench. The material of a distributed Bragg reflector usually includes aluminum (Al). Therefore, after the etching, Al is oxidized to form an oxidation layer 70. In FIG. 1, the oxidation layer 70 merely represents the oxidation layer formed by the layer with the highest Al content. The oxidation layer 70 may provide optical and electrical confinement of the emitters 101 and can define the diameter of an oxidation aperture (OA) of an emitter 101. To prevent Al from being oxidized, the passivation layer 80, for example, silicon nitride, may be formed on the inner wall of the trench. In this embodiment, after the passivation layer 80 is formed, the second dielectric layer 42, the second electrode 32, the first dielectric layer 41, and the first electrode 31 may be processed (such as deposition) in sequence. In this case, the trench may be filled with structures such as the first dielectric layer 41 and the second dielectric layer 42 so as to isolate the emitters 101 from each other.

Of course, the structure is not limited. In other embodiments, the semiconductor light source (for example, the VCSEL) may include only one emitter. The structure can be configured by those skilled in the art according to actual requirements and is not limited in embodiments of the present disclosure.

Optionally, as shown in FIG. 2, the semiconductor light source further includes the substrate 50. The first semiconductor layer 21 is located on a side of the second semiconductor layer 22 facing away from the substrate 50. For the VCSEL, the semiconductor light source may emit a light beam in the direction of the substrate 50 pointing to the active layer 10; alternatively, the semiconductor light source may emit a light beam in the direction of the active layer 10 pointing to the substrate 50. That is, the VCSEL may emit light beam from a front side (a side facing away from the substrate 50) or emit light beam from a back side (a side facing the substrate 50). According to different light emission directions, the first electrode 31 and the third electrode 33 may have different adaptive settings. As shown in FIGS. 2 and 3, the VCSEL emits light beam from the front side. The first electrode 31 is deposited around a light emission window to expose the oxidation aperture. The third electrode 33 may be a whole-surface electrode.

It is to be noted here that the first electrode 31 may be in ohmic contact with the first semiconductor layer 21 through a ring electrode (ohmic metal) 60. The process of the ring electrode 60 is after the process of the first semiconductor layer 21 and before the etching of structures such as the first semiconductor layer 21. The inner diameter of the ring electrode 60 may be larger than the inner diameter of the oxidation layer 70. The arrangement of vias on the passivation layer 80 enables the first electrode 31 to be in contact with the ring electrode 60, thereby enabling the first electrode 31 to be in ohmic contact with the first semiconductor layer 21. The structure is not limited. In other embodiments, the first electrode 31 may be in ohmic contact with the first semiconductor layer 21 directly. That is, no ring electrode 60 is processed.

Figure 11:
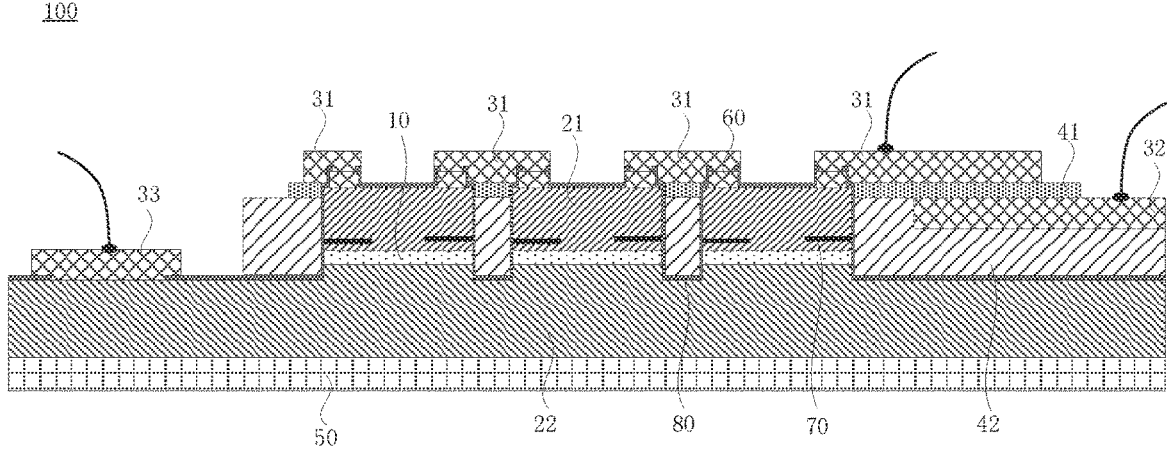
FIG. 11 is a section view illustrating the structure of another semiconductor light source according to embodiments of the present application.
Figure 12:
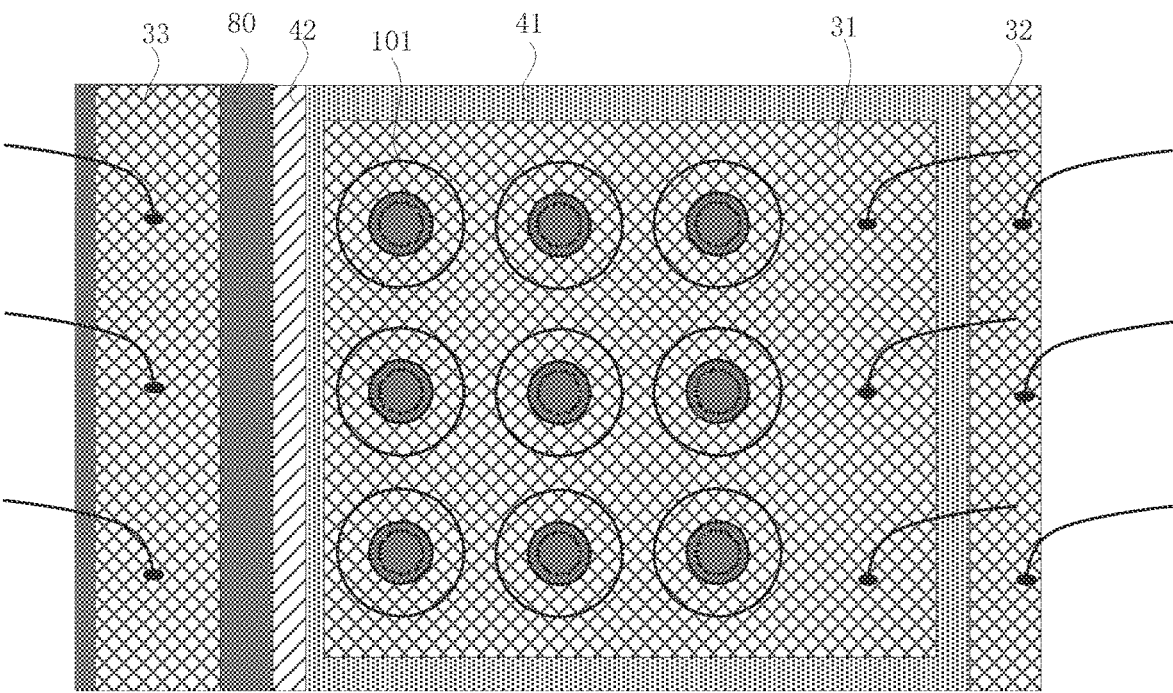
FIG. 12 is a top view illustrating the structure of the semiconductor light source corresponding to FIG. 11.

It is to be noted here that an example in which the third electrode 33 is located on a side of the substrate 50 facing away from the second semiconductor layer 22 is taken for illustration in FIG. 2. In this case, the substrate 50 needs to have conductive characteristics in order to close a current loop. The structure is not limited. Exemplarily, FIG. 11 is a section view illustrating the structure of another semiconductor light source according to embodiments of the present application. FIG. 12 is a top view illustrating the structure of the semiconductor light source corresponding to FIG. 11. Referring to FIGS. 11 and 12, when the VCSEL emits light beam from the front side, the third electrode 33 may also be located on a side of the second semiconductor layer 22 facing away from the substrate 50. In this case, the orthographic projection of the second electrode 32 on the plane where the active layer 10 is located does not overlap the orthographic projection of the third electrode 33 on the plane where the active layer is located. The substrate 50 may be an insulating substrate or a semi-insulating substrate. The arrangement of vias on the passivation layer 80 enables the third electrode 33 to be in ohmic contact with the second semiconductor layer 22. In other embodiments, an ohmic contact layer (not shown in the drawings and referring to the design of ohmic metal 60 in FIG. 2) may further be included so as to enable the third electrode 33 to be in ohmic contact with the ohmic contact layer. The ohmic contact layer may be disposed inside the second semiconductor layer 22 and may also be disposed between the second semiconductor layer 22 and the substrate 50, which is designed according to actual requirements.

Figure 13:
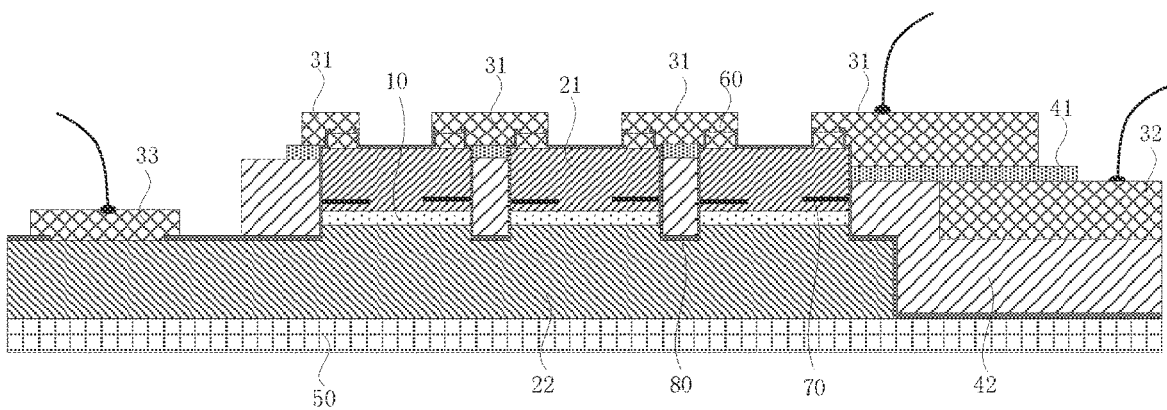
FIG. 13 is a section view illustrating the structure of another semiconductor light source according to embodiments of the present application.

FIG. 13 is a section view illustrating the structure of another semiconductor light source according to embodiments of the present application. Referring to FIG. 13, when the orthographic projection of the second electrode 32 on the plane where the active layer 10 is located does not overlap the orthographic projection of the third electrode 33 on the plane where the active layer 10 is located, optionally, the orthographic projection of the second electrode 32 on the plane where the active layer 10 is located does not overlap the orthographic projection of the second semiconductor layer 22 on the plane where the active layer 10 is located. The third electrode 33 is disposed on the second semiconductor layer 22 and has a conductive effect. With this arrangement, the second electrode 32, the second dielectric layer 42, and the second semiconductor layer 22 are prevented from forming a capacitor structure. Therefore, when the semiconductor light source 100 is connected to an external circuit, the generation of the capacitor is prevented from affecting circuit performance Exemplarily, referring to FIG. 13, at least part of the second semiconductor layer 22 corresponding to the second electrode 32 is etched away. Therefore, the orthographic projection of the second electrode 32 on the plane where the active layer 10 is located does not overlap the orthographic projection of the second semiconductor layer 22 on the plane where the active layer 10 is located.

Figure 14:
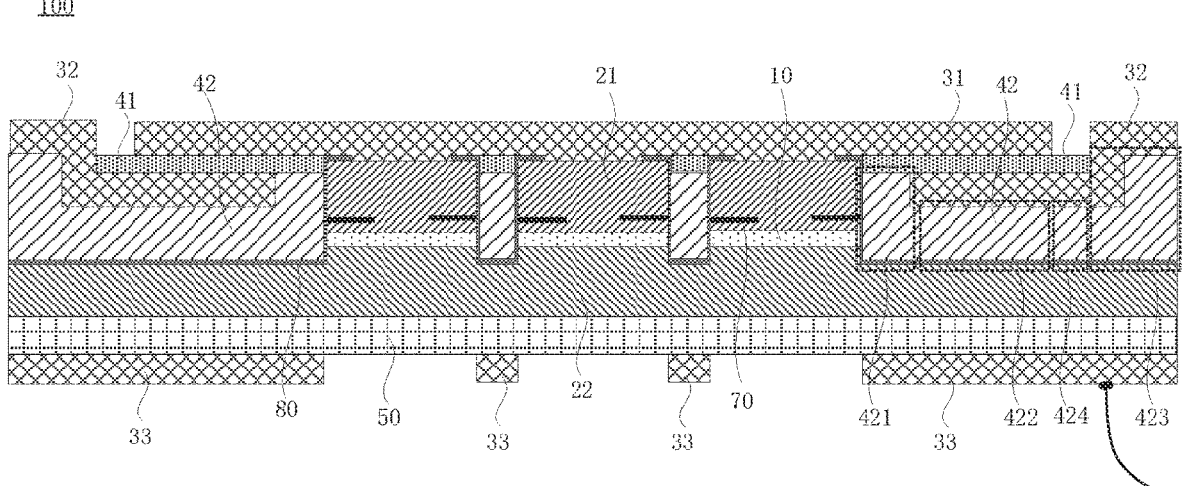
FIG. 14 is a section view illustrating the structure of another semiconductor light source according to embodiments of the present application.
Figure 15:
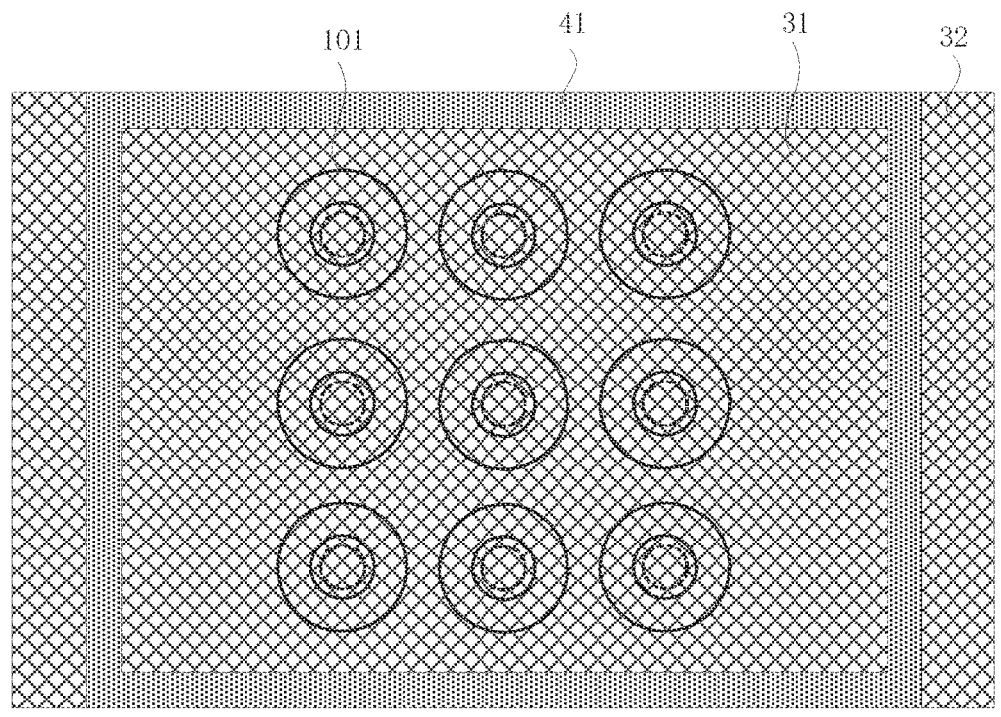
FIG. 15 is a top view illustrating the structure of the semiconductor light source corresponding to FIG. 14.

FIG. 14 is a section view illustrating the structure of another semiconductor light source according to embodiments of the present application. FIG. 15 is a top view illustrating the structure of the semiconductor light source corresponding to FIG. 14. As shown in FIGS. 14 and 15, the VCSEL may also emit light beam from the back side. The third electrode 33 is located on a side of the substrate 50 facing away from the second semiconductor layer 22. Therefore, the third electrode 33 is deposited around a light emission window to expose the oxidation aperture. Moreover, the substrate 50 needs to be a conductive substrate 50. The first electrode 31 may be a whole-surface electrode to cover all the emitters 101. The arrangement of vias on the passivation layer 80 enables the first electrode 31 to be in ohmic contact with the first semiconductor layer 21.

Figure 16:
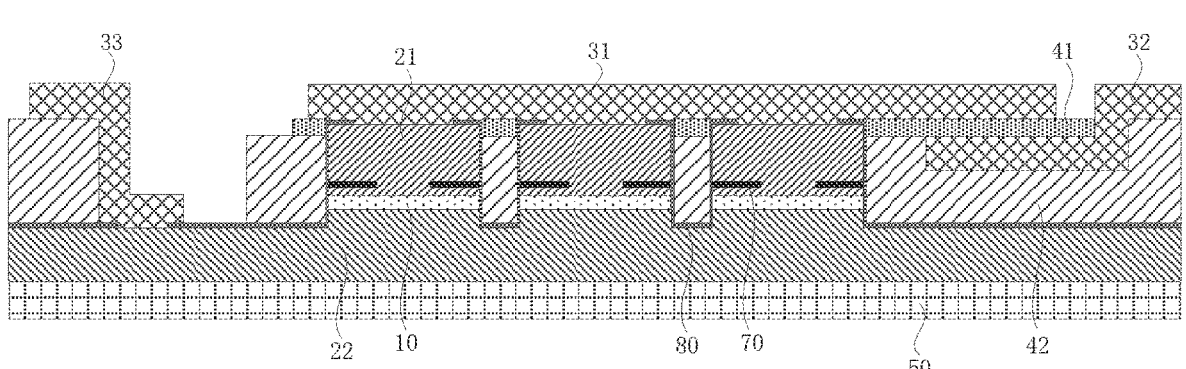
FIG. 16 is a section view illustrating the structure of another semiconductor light source according to embodiments of the present application.
Figure 17:
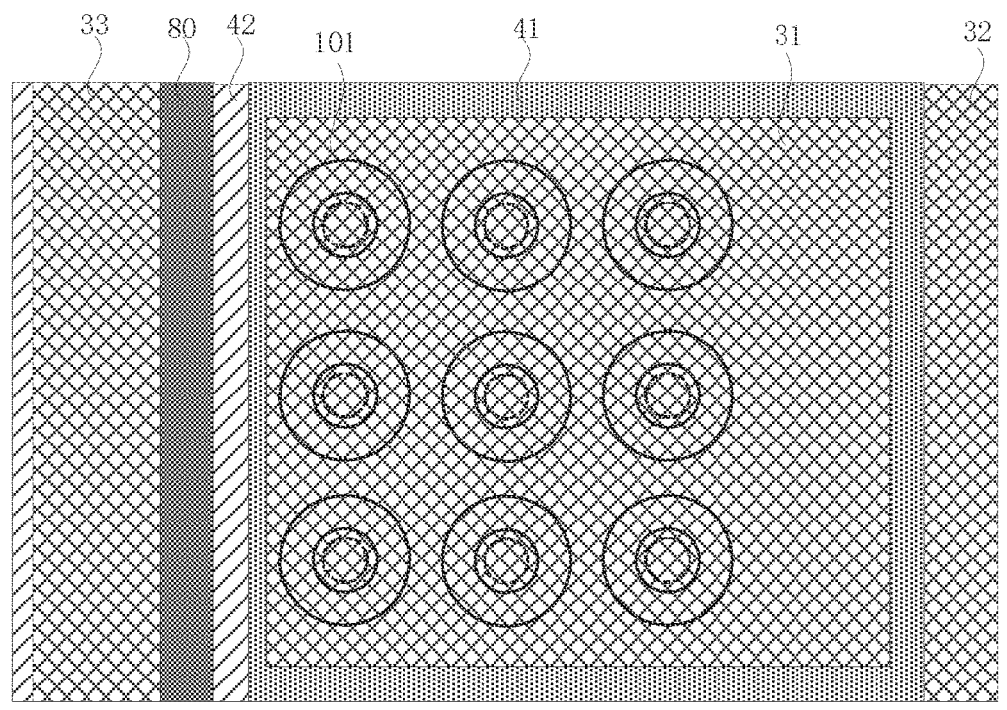
FIG. 17 is a top view illustrating the structure of the semiconductor light source corresponding to FIG. 16.

As above, the structure is not limited. In other embodiments, referring to FIGS. 16 and 17, FIG. 16 is a section view illustrating the structure of another semiconductor light source according to embodiments of the present application, and FIG. 17 is a top view illustrating the structure of the semiconductor light source corresponding to FIG. 16. When the VCSEL emits light beam from the back side, the third electrode 33 may also be disposed on a side of the second semiconductor layer 22 facing away from the substrate 50. In this case, the substrate 50 may be an insulating substrate or a semi-insulating substrate. The arrangement of vias on the passivation layer 80 enables the third electrode 33 to be in ohmic contact with the second semiconductor layer 22.

Figure 18:
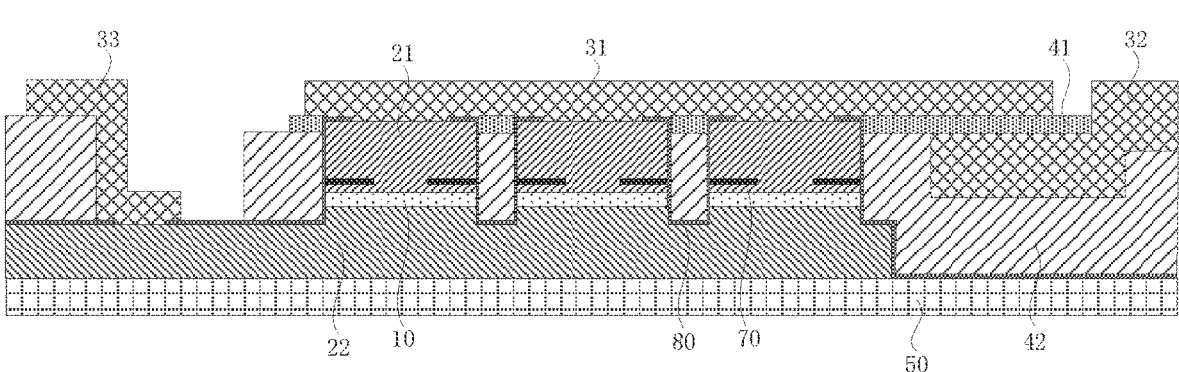
FIG. 18 is a section view illustrating the structure of another semiconductor light source according to embodiments of the present application.

FIG. 18 is a section view illustrating the structure of another semiconductor light source according to embodiments of the present application. Referring to FIG. 18, in this embodiment, the orthographic projection of the second electrode 32 on the plane where the active layer 10 is located does not overlap the orthographic projection of the third electrode 33 on the plane where the active layer 10 is located. In this case, optionally, the orthographic projection of the second electrode 32 on the plane where the active layer 10 is located does not overlap the orthographic projection of the second semiconductor layer 22 on the plane where the active layer 10 is located. With this arrangement, the second electrode 32, the second dielectric layer 42, and the second semiconductor layer 22 are prevented from forming a capacitor structure, preventing the generation of the capacitor from affecting circuit performance.

It is to be noted that an exemplary description is made here merely by taking an example in which when the third electrode 33 is located on a side of the second semiconductor layer 22 facing away from the substrate 50, the orthographic projection of the second electrode 32 on the plane where the active layer 10 is located does not overlap the orthographic projection of the second semiconductor layer 22 on the plane where the active layer 10 is located. Referring to FIG. 18, when the third electrode 33 is located on a side of the substrate 50 facing away from the second semiconductor layer 22, at least part of the third electrode 33 corresponding to the second electrode 32 and at least part of the second semiconductor layer 22 corresponding to the second electrode 32 may be etched away. With this arrangement, the orthographic projection of the second electrode 32 on the plane where the active layer 10 is located overlaps neither the orthographic projection of the second semiconductor layer 22 on the plane where the active layer 10 is located nor the orthographic projection of the third electrode 33 on the plane where the active layer 10 is located, preventing the second electrode 32 and the second semiconductor layer 22/the third electrode 33 from forming a capacitor.

Additionally, it is to be noted that here the orthographic projection of the second electrode 32 on the plane where the active layer 10 is located overlaps neither the orthographic projection of the third electrode 33 on the plane where the active layer 10 is located nor the orthographic projection of the second semiconductor layer 22 on the plane where the active layer 10 is located. An exemplary description is made merely by taking an example in which the semiconductor light source is a VCSEL. In subsequent embodiments, the semiconductor light source 100 may also be a light-emitting diode or an edge-emitting laser diode. For such a semiconductor light source, the orthographic projection of the second electrode 32 on the plane where the active layer 10 is located overlaps neither the orthographic projection of the third electrode 33 on the plane where the active layer 10 is located nor the orthographic projection of the second semiconductor layer 22 on the plane where the active layer 10 is located, which is not repeated hereinafter.

Figure 19:
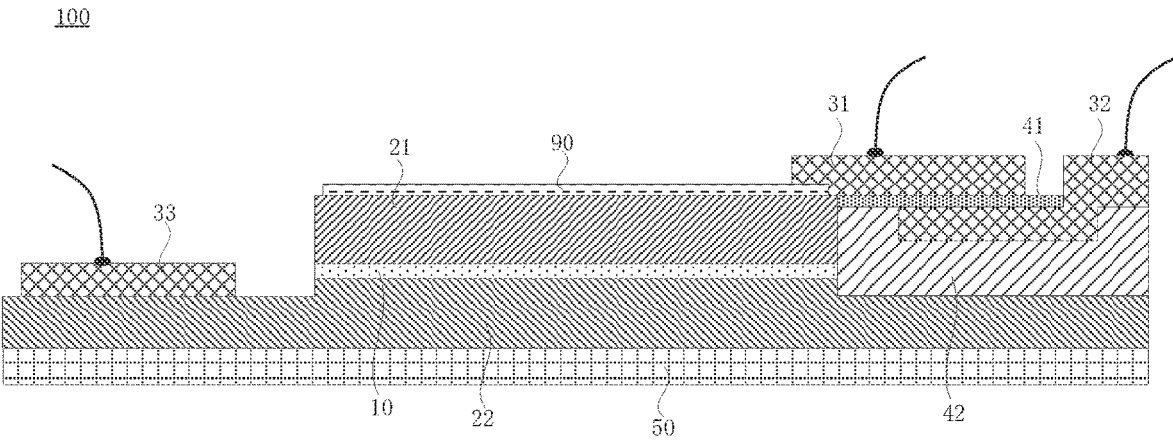
FIG. 19 is a section view illustrating the structure of another semiconductor light source according to embodiments of the present application.
Figure 20:
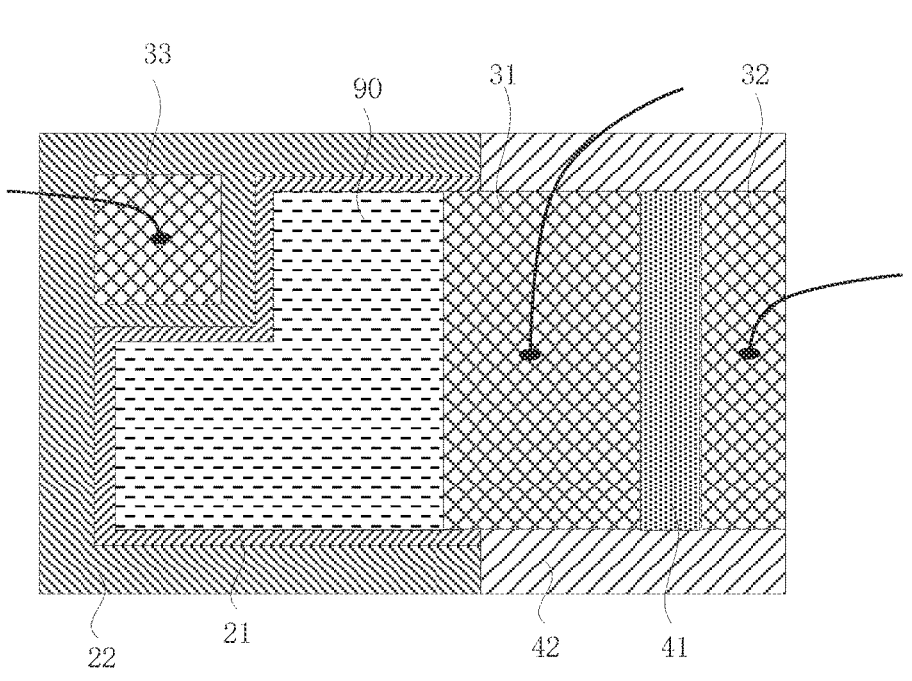
FIG. 20 is a top view illustrating the structure of the semiconductor light source corresponding to FIG. 19.

In another optional solution, the semiconductor light source may be, for example, a light-emitting diode (LED). FIG. 19 is a section view illustrating the structure of another semiconductor light source according to embodiments of the present application. FIG. 20 is a top view illustrating the structure of the semiconductor light source corresponding to FIG. 19. Referring to FIGS. 19 and 20, optionally, the semiconductor light source 100 is a light-emitting diode. The first semiconductor layer 21 is located on the light emission side of the light-emitting diode. A transparent electrode 90 is disposed on a side of the first semiconductor layer 21 facing away from the active layer 10. The transparent electrode 90 is in ohmic contact with the first semiconductor layer 21. The first electrode 31 is in contact with the transparent electrode 90.

For the light-emitting diode, the active layer 10 may refer to a light-emitting layer. The first semiconductor layer 21 may include at least two first sub-semiconductor layers (not shown in the drawings) with different materials, and the second semiconductor layer 22 may include at least two second sub-semiconductor layers (not shown in the drawings) with different materials. Exemplarily, the first semiconductor layer 21 is a p-type semiconductor layer and the second semiconductor layer 22 is an n-type semiconductor layer. In this case, the first semiconductor layer 21 may include, for example, layers such as a hole injection layer, a hole transport layer, and an electron blocking layer; and the second semiconductor layer 22 may include, for example, layers such as an electron injection layer, an electron transport layer, and a hole blocking layer.

As shown in FIG. 19, the first semiconductor layer 21 is located on the light emission side of the light-emitting diode. When the first semiconductor layer 21 is a p-type semiconductor layer, the first electrode 31 is the positive electrode (anode). The light from the light-emitting diode emits from the anode. When the first semiconductor layer 21 is an n-type semiconductor layer, the first electrode 31 is the negative electrode (cathode). The light from the light-emitting diode emits from the cathode. Since the first electrode 31 is not light-transmissive, the transparent electrode 90, for example, a transparent conductive material such as indium tin oxide (ITO), needs to be disposed on a side of the first semiconductor layer 21 facing away from the active layer 10. The first electrode 31 is in contact with the transparent electrode 90 so as to be in ohmic contact with the first semiconductor layer 21.

It is to be noted that an example in which the third electrode 33 is located on a side of the second semiconductor layer 22 facing away from the substrate 50 is taken merely for illustration in FIG. 19. The structure is not limited. In other embodiments, a conductive substrate 50 may also be adopted, and the third electrode 33 is located on a side of the substrate 50 facing away from the second semiconductor layer 22.

It is to be further noted that an example in which the semiconductor light source (for example, the light-emitting diode) includes one emitter is taken merely for illustration in FIG. 19. In other embodiments, referring to FIG. 2, the semiconductor light source is configured to include a plurality of emitters arranged in an array. Moreover, a passivation layer and a dielectric layer (including at least the first dielectric layer) are disposed between adjacent emitters so that the emitters are separated from each other. Reference may be made to the preceding description and is not repeated here.

Figure 21:
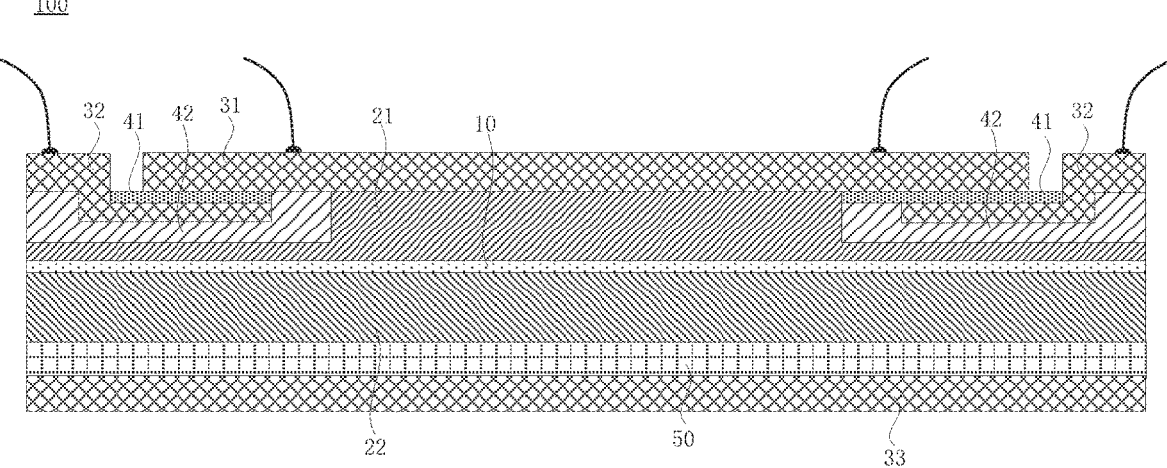
FIG. 21 is a section view illustrating the structure of another semiconductor light source according to embodiments of the present application.
Figure 22:
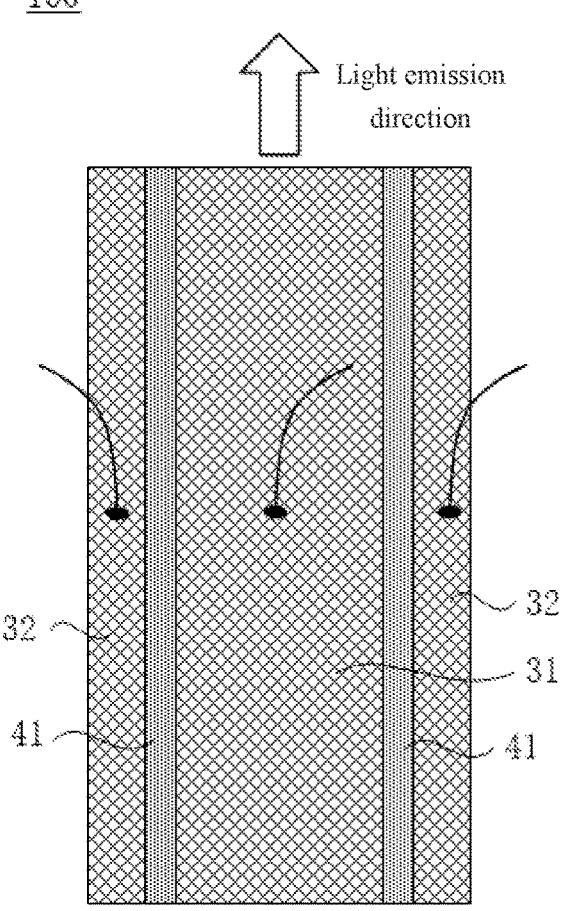
FIG. 22 is a top view illustrating the structure of the semiconductor light source corresponding to FIG. 21.

In another optional solution, the semiconductor light source may be, for example, an edge-emitting laser diode (EELD). FIG. 21 is a section view illustrating the structure of another semiconductor light source according to embodiments of the present application. FIG. 22 is a top view illustrating the structure of the semiconductor light source corresponding to FIG. 21. Referring to FIGS. 21 and 22, optionally, the semiconductor light source 100 is an edge-emitting laser diode. The second electrode 32 is located on a side of the first electrode 31 facing the active layer 10. The second dielectric layer 42 and the first semiconductor layer 21 that are stacked are included between the second electrode 32 and the active layer 10. The first semiconductor layer 21 is located on a side of the second dielectric layer 42 facing away from the second electrode 32.

When the semiconductor light source is an edge-emitting laser diode, the first semiconductor layer 21 may include at least two first sub-semiconductor layers (not shown in the drawings) with different materials, and the second semiconductor layer 22 may include at least two second sub-semiconductor layers (not shown in the drawings) with different materials. For example, the first semiconductor layer 21 may include at least two layers made of III-V semiconductor materials, and the second semiconductor layer 22 may include at least two layers made of III-V semiconductor materials. III-V semiconductor materials include, but are not limited to, GaAs, AlGaAs, InGaAs, AlAs, InAs, InP, GaAsP, InGaP, GaP, AlAsP, AlP, GaN, AlGaN, AlN, and InAlN.

As shown in FIG. 22, the edge-emitting laser diode emits light beam from the edge of the device. As shown in FIG. 21, when the second electrode 32 is located on a side of the first electrode 31 facing the active layer 10, the first semiconductor layer 21 may be etched. Moreover, the second dielectric layer 42 is disposed between the first semiconductor layer 21 and the second electrode 32 to insulate the second electrode 32 from the first semiconductor layer 21.

It is to be further noted that an example in which the semiconductor light source (for example, the edge-emitting laser diode) includes one emitter is taken merely for illustration in FIG. 21. In other embodiments, referring to FIG. 2, the semiconductor light source is configured to include a plurality of emitters arranged in an array. Moreover, a passivation layer and a dielectric layer (including at least the first dielectric layer) are disposed between adjacent emitters so that the emitters are separated from each other. Reference may be made to the preceding description and is not repeated here. The edge-emitting laser diode emits light beam from the edge of the device. Therefore, when the edge-emitting laser diode includes a plurality of emitters arranged in an array, optionally, the emitters are arranged in a 1*m array (where m is an integer greater than or equal to 2).

To sum up, in the preceding embodiments, different types of device structures are described in detail by taking an example in which the semiconductor light source is a vertical-cavity surface-emitting laser, a light-emitting diode, or an edge-emitting laser diode. Those skilled in the art may design the structures of different types of semiconductor light sources according to actual situations. Any solution in which a semiconductor light source integrated with a capacitor is obtained by using a solution in embodiments of the present application is within the scope of the present application.

On the basis of the preceding embodiments, the structure of the second dielectric layer 42 is described in detail hereinafter. Exemplarily, referring to FIG. 2 or 14, the second electrode 32 is located on a side of the first electrode 31 facing the second semiconductor layer 22, and the second dielectric layer 42 is disposed on a side of the second electrode 32 facing away from the first electrode 31. Optionally, the second dielectric layer 42 includes a first dielectric portion 421, a second dielectric portion 422, a third dielectric portion 423, and a fourth dielectric portion 424. The orthographic projection of the first electrode 31 on the plane where the active layer 10 is located and the orthographic projection of the first dielectric layer 41 on the plane where the active layer 10 is located each overlap the orthographic projection of the first dielectric portion 421 on the plane where the active layer is located 10. The orthographic projection of the first dielectric portion 421 on the plane where the active layer 10 is located does not overlap the orthographic projection of the second electrode 32 on the plane where the active layer 10 is located. The orthographic projection of the first electrode 31 on the plane where the active layer 10 is located, the orthographic projection of the first dielectric layer 41 on the plane where the active layer 10 is located, and the orthographic projection of the second electrode 32 on the plane where the active layer 10 is located each overlap the orthographic projection of the second dielectric portion 422 on the plane where the active layer 10 is located. The orthographic projection of the second electrode 32 on the plane where the active layer 10 is located overlaps the orthographic projection of the third dielectric portion 423 on the plane where the active layer 10 is located. The orthographic projection of the third dielectric portion 423 on the plane where the active layer 10 is located overlaps neither the orthographic projection of the first electrode 31 on the plane where the active layer 10 is located nor the orthographic projection of the first dielectric layer 41 on the plane where the active layer 10 is located. The orthographic projection of the first dielectric layer 41 on the plane where the active layer 10 is located and the orthographic projection of the second electrode 32 on the plane where the active layer 10 is located each overlap the orthographic projection of the fourth dielectric portion 424 on the plane where the active layer 10 is located. The orthographic projection of the fourth dielectric portion 424 on the plane where the active layer 10 is located does not overlap the orthographic projection of the first electrode 31 on the plane where the active layer 10 is located. In the direction perpendicular to the plane where the active layer 10 is located, the thickness of the first dielectric portion 421 is greater than the thickness of the second dielectric portion 422, and the thickness of the third dielectric portion 423 is greater than or equal to the thickness of the second dielectric portion 422. An example in which the thickness of the third dielectric portion 423 is equal to the thickness of the second dielectric portion 422 is taken for illustration in FIG. 2. An example in which the thickness of the third dielectric portion 423 is greater than the thickness of the second dielectric portion 422 is taken for illustration in FIG. 14.

In this embodiment, the second dielectric layer 42 is divided into four parts according to the stacking of the second dielectric layer 42, the first electrode 31, the second electrode 32, and the first dielectric layer 41. The four parts are the first dielectric portion 421, the second dielectric portion 422, the third dielectric portion 423, and the fourth dielectric portion 424. The thickness of the second dielectric portion 422 may be equal to the thickness of the fourth dielectric portion 424. The first dielectric portion 421, the second dielectric portion 422, and the third dielectric portion 423 may have different thicknesses so as to achieve the effects mentioned above, such as improving the yield of the semiconductor light source and improving the electrical connection between the semiconductor light source and the external driver circuit.

Taking FIG. 14 for example, the arrangement in which the thickness of the first dielectric portion 421 and the thickness of the third dielectric portion 423 are greater than the thickness of the second dielectric portion 422 helps partially elevate the first electrode 31 and the second electrode 32 so that the upper surface of the first electrode 31 and the upper surface of the second electrode are flush. With this arrangement, the first electrode 31 and the second electrode 32 are electrically connected to the external driver circuit in the manner of attachment with no need for bonding gold wires on the first electrode 31 and the second electrode 32, thereby simplifying the electrical connection between the semiconductor light source and the external driver circuit. Additionally, in FIG. 14, the VCSEL emits light beam from the back side, and the third electrode 33 is located on the light emission side. Therefore, the third electrode 33 may be electrically connected to the external driver circuit in the manner of bonding gold wires.

Of course, in other embodiments, the thickness of the first dielectric portion 421 may also be configured to be greater than the thickness of the second dielectric portion 422, for example, as shown in FIG. 2. With this arrangement, the first dielectric portion 421 can provide enough support for the first electrode 31, so as to avoid the effect on device quality when the first electrode 31 is bonded with gold wires, and improve the yield of the semiconductor light source.

Additionally, referring to FIG. 4, the second electrode 32 is located on a side of the first electrode 31 facing away from the second semiconductor layer 22, and the second dielectric layer 42 is disposed on a side of the first electrode 31 facing away from the second electrode 32. Optionally, the second dielectric layer 42 includes a fifth dielectric portion 425, a sixth dielectric portion 426, and a seventh dielectric portion 427. The orthographic projection of the first electrode 31 on the plane where the active layer 10 is located overlaps the orthographic projection of the fifth dielectric portion 425 on the plane where the active layer 10 is located. The orthographic projection of the fifth dielectric portion 425 on the plane where the active layer 10 is located overlaps neither the orthographic projection of the first dielectric layer 41 on the plane where the active layer 10 is located nor the orthographic projection of the second electrode 32 on the plane where the active layer 10 is located. The orthographic projection of the first electrode 31 on the plane where the active layer 10 is located and the orthographic projection of the first dielectric layer 41 on the plane where the active layer 10 is located each overlap the orthographic projection of the sixth dielectric portion 426 on the plane where the active layer 10 is located. The orthographic projection of the sixth dielectric portion 426 on the plane where the active layer 10 is located does not overlap the orthographic projection of the second electrode 32 on the plane where the active layer 10 is located. The orthographic projection of the first electrode 31 on the plane where the active layer 10 is located, the orthographic projection of the first dielectric layer 41 on the plane where the active layer 10 is located, and the orthographic projection of the second electrode 32 on the plane where the active layer 10 is located each overlap the orthographic projection of the seventh dielectric portion 427 on the plane where the active layer 10 is located. In the direction perpendicular to the plane where the active layer 10 is located, the thickness of the seventh dielectric portion 427 is greater than or equal to the thickness of the sixth dielectric portion 426.

This design concept is the same as the design concept in FIG. 2 or 14 and is not repeated here. It is to be noted that an example in which the thickness of the seventh dielectric portion 427 is equal to the thickness of the sixth dielectric portion 426 is taken merely for illustration in FIG. 4. In other embodiments, optionally, the thickness of the seventh dielectric portion 427 is greater than the thickness of the sixth dielectric portion 426. With this arrangement, when the upper surface of the second electrode 32 and the upper surface of the first electrode 31 are not in the same plane, the seventh dielectric portion 427 with a greater thickness helps elevate the second electrode 32 so that the upper surface of the first electrode 31 and the upper surface of the second electrode 32 are flush, omitting the wire bonding process.

Design concepts of the second dielectric layer 42 in other drawings in FIGS. 2 to 20 are the same as this design concept and are not repeated here. Only FIGS. 2, 4, and 14 are used as examples for description.

Embodiments of the present application further provide a driver circuit of a semiconductor light source. The driver circuit is configured to drive the semiconductor light source 100 provided in any preceding embodiment. The driver circuit is improved based on a traditional dToF driver circuit. The semiconductor light source is integrated with the capacitor. Therefore, the series inductance between the capacitor and the semiconductor light source is greatly reduced, thereby improving the performance of the driver circuit, omitting the capacitor in the original dToF driver circuit, and simplifying circuit design.

Figure 23:
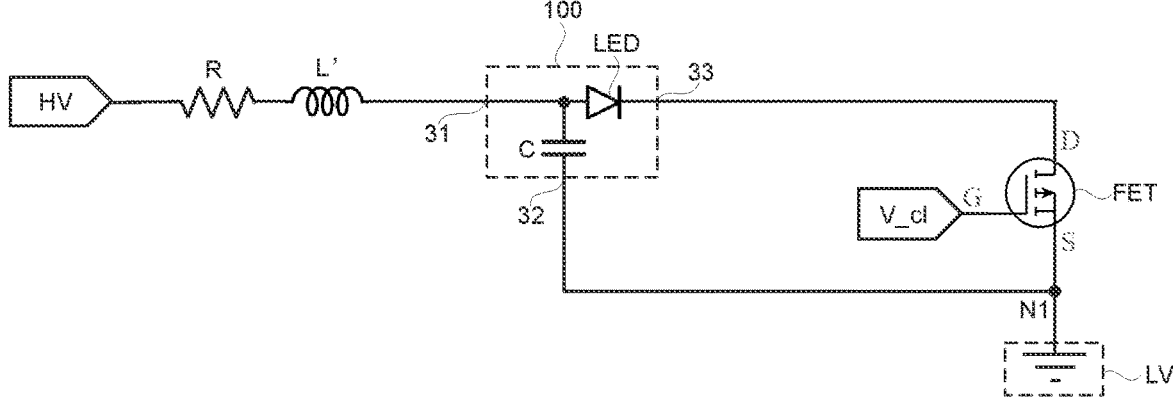
FIG. 23 is a diagram illustrating the structure of a driver circuit of a semiconductor light source according to embodiments of the present application.
Figure 24:
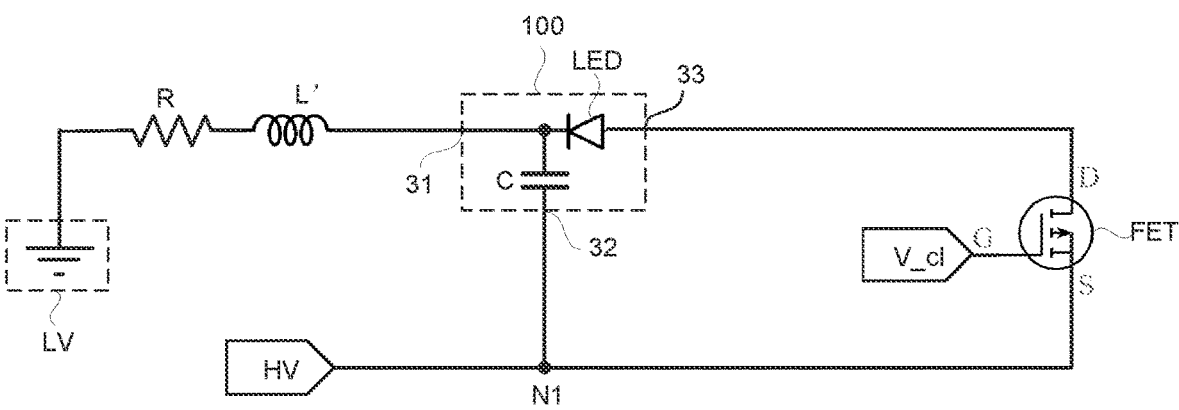
FIG. 24 is a diagram illustrating the structure of another driver circuit of a semiconductor light source according to embodiments of the present application.

FIG. 23 is a diagram illustrating the structure of a driver circuit of a semiconductor light source according to embodiments of the present application. FIG. 24 is a diagram illustrating the structure of another driver circuit of a semiconductor light source according to embodiments of the present application. Referring to FIG. 23 or 24, optionally, the driver circuit includes a first voltage source HV, a second voltage source LV, a charging resistor R, a field-effect transistor PET, and a control signal source V-cl. The voltage of the first voltage source HV is greater than the voltage of the second voltage source LV. A first pole of the field-effect transistor FET is electrically connected to the third electrode 33 of the semiconductor light source 100. A second pole of the field-effect transistor FET is electrically connected to the second electrode 32 of the semiconductor light source 100 through a first node N1. The gate (G) of the field-effect transistor FET is electrically connected to the control signal source V-cl. The first pole is the drain (D) of the field-effect transistor, and the second pole is the source (S) of the field-effect transistor FET. Alternatively, the first pole is the source of the field-effect transistor FET, and the second pole is the drain of the field-effect transistor FET. The first voltage source HV is coupled with (that is, directly or indirectly electrically connected to) the positive electrode in the semiconductor light source 100. The second voltage source LV is coupled with the negative electrode in the semiconductor light source 100. The positive electrode is an electrode that is in ohmic contact with a p-type semiconductor layer in the semiconductor light source 100. The negative electrode is an electrode that is in ohmic contact with an n-type semiconductor layer in the semiconductor light source. The charging resistor R is connected in series in a loop composed of the first voltage source HV, the first electrode 31, the second electrode 32, and the second voltage source LV. Optionally, the voltage of the first voltage source is greater than 0 V, and the second voltage source is grounded.

An example in which the semiconductor light source 100 is a light-emitting diode is taken for illustration in FIGS. 23 and 24. In the semiconductor light source 100 provided in embodiments of the present application, the light-emitting diode LED and the capacitor C are integrated as a whole and share the first electrode 31.

As shown in FIG. 23 or 24, the arrangement in which the charging resistor R is connected in series in a loop composed of the first voltage source HV, the first electrode 31, the second electrode 32, and the second voltage source LV helps charge the capacitor C.

The positive electrode in the semiconductor light source 100 and the negative electrode in the semiconductor light source 100 are the first electrode 31 of the semiconductor light source 100 and the third electrode 33 of the semiconductor light source 100 respectively. The light-emitting diode LED and the capacitor C share the first electrode 31. Another electrode (that is, the third electrode 33) of the light-emitting diode LED is electrically connected to another capacitor plate (that is, the second electrode 32) of the capacitor C through the first node N1. Therefore, the first voltage source HV is electrically connected to the positive electrode in the semiconductor light source 100, and the second voltage source LV is electrically connected to the negative electrode of the semiconductor light source 100. In this case, the first voltage source HV and the second voltage source LV are electrically connected to the two capacitor plates (that is, the first electrode 31 and the second electrode 32) of the capacitor C respectively, helping charge the capacitor C. Moreover, it can guarantee that after the capacitor C is charged, the high-potential capacitor plate and the low-potential capacitor plate correspond to the positive electrode of the light-emitting diode LED and the negative electrode of the light-emitting diode LED respectively.

The third electrode 33 of the semiconductor light source 100 is electrically connected to the first pole (for example, the drain D) of the field-effect transistor PET, and the second electrode 32 of the semiconductor light source 100 is electrically connected to the second pole (for example, the source S) of the field-effect transistor FET. With this arrangement, after the capacitor C is charged, the field-effect transistor FET can be turned on so that the capacitor C discharges the light-emitting diode LED to drive the light-emitting diode LED to emit light. It is to be understood that the on-off state of the field-effect transistor PET is controlled by the control signal source V-cl. Exemplarily, a signal of the control signal source V-cl may be a pulse voltage signal.

According to the description of the preceding embodiments related to the semiconductor light source 100, the first electrode 31 and the third electrode 33 may each be the positive electrode of the semiconductor light source 100 or the negative electrode of the semiconductor light source 100, which is determined according to the doping type of the first semiconductor layer 21 and the doping type of the second semiconductor layer 22. A detailed description of the connection relationship between the driver circuit and the semiconductor light source 100 is made hereinafter based on the polarity of the first electrode 31 and the polarity of the third electrode 33.

In a feasible embodiment, referring to FIG. 23, optionally, the first semiconductor layer is a p-type semiconductor layer. The first electrode 31 is the positive electrode. The second semiconductor layer is an n-type semiconductor layer. The third electrode 33 is the negative electrode. In this case, optionally, a first end of the charging resistor R is electrically connected to the first voltage source HV. A second end of the charging resistor R is electrically connected to the first electrode 31 of the semiconductor light source 100. The third electrode 33 of the semiconductor light source 100 is electrically connected to the first pole of the field-effect transistor PET. The first node N1 is electrically connected to the second voltage source LV. The gate of the field-effect transistor PET is electrically connected to the control signal source V-cl. For the operation process, refer to the preceding description, which is not repeated here.

In another feasible embodiment, referring to FIG. 24, optionally, the first semiconductor layer is an n-type semiconductor layer. The first electrode 31 is the negative electrode. The second semiconductor layer is a p-type semiconductor layer. The third electrode 33 is the positive electrode. In this case, optionally, the first end of the charging resistor R is electrically connected to the second voltage source LV. The second end of the charging resistor R is electrically connected to the first electrode 31 of the semiconductor light source 100. The third electrode 33 of the semiconductor light source 100 is electrically connected to the first pole of the field-effect transistor FET. The first node N1 is electrically connected to the first voltage source HV. For the operation process, refer to the preceding description, which is not repeated here.

Figure 25:
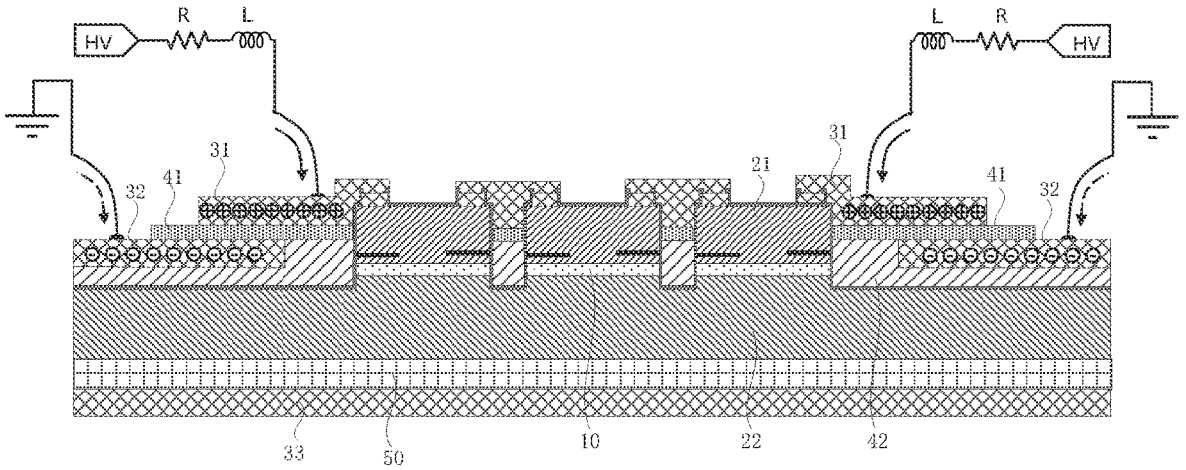
FIG. 25 is a diagram illustrating the process of the capacitor charging phase of a driver circuit.
Figure 26:
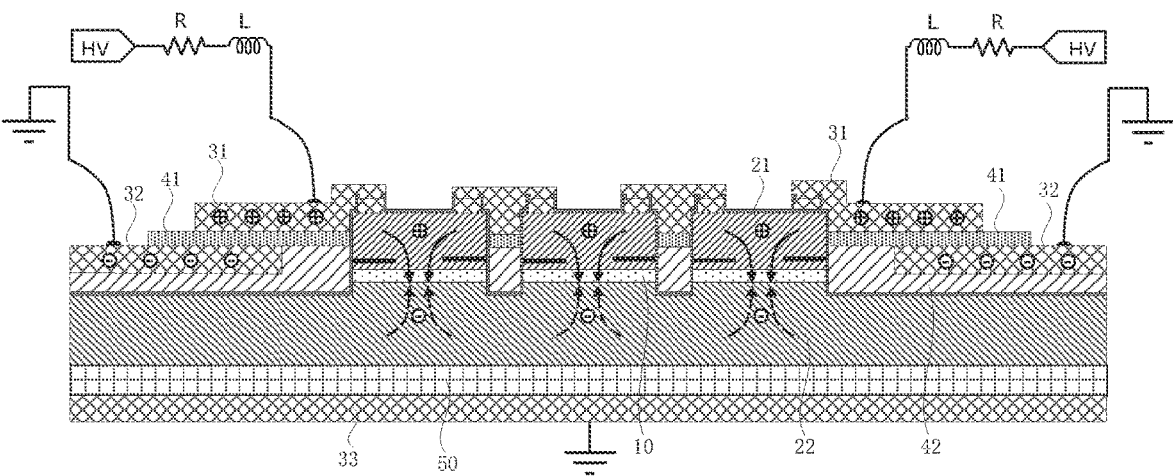
FIG. 26 is a diagram illustrating the process of the capacitor discharging phase of a driver circuit.

Exemplarily, FIG. 25 is a diagram illustrating the process of the capacitor charging phase of a driver circuit. FIG. 26 is a diagram illustrating the process of the capacitor discharging phase of a driver circuit. An example is taken in which the semiconductor light source 100 is a VCSEL, the first electrode 31 is the positive electrode, and the third electrode 33 is the negative electrode. With this arrangement, a change of charges on the capacitor plates (that is, the first electrode 31 and the second electrode 32) in the charging process and discharging process is illustrated. Referring to FIG. 25, in the capacitor charging phase, positive charges are accumulated on the first electrode 31, and negative charges are accumulated on the second electrode 32. Referring to FIG. 26, in the capacitor discharging phase, the field-effect transistor turns on, and the second electrode 32 and the third electrode 33 are grounded. Therefore, the positive charges on the first electrode 31 are reduced, and the negative charges on the second electrode 32 are reduced. The capacitor is discharged for the semiconductor light source (for example, the VCSEL) so that the VCSEL absorbs electric energy to generate energy excitation and emit light of a certain wavelength. Then the light is reflected back and forth by the upper distributed Bragg reflector (for example, the first semiconductor layer 21) and the lower distributed Bragg reflector (for example, the second semiconductor layer 22) to generate resonance amplification, thereby generating a high-energy laser beam and emitting the laser beam from the oxidation aperture.

From FIGS. 23 and 24, since the semiconductor light source 100 is integrated with the capacitor, almost no series inductance exists between the capacitor C and the semiconductor light source (for example, an LED). The series inductance L' in the driver circuit is basically generated through the submount wiring between the charging resistor R and the capacitor C. Therefore, technical solutions in embodiments of the present application can significantly improve the performance of the driver circuit and simplify circuit design.

Figure 27:
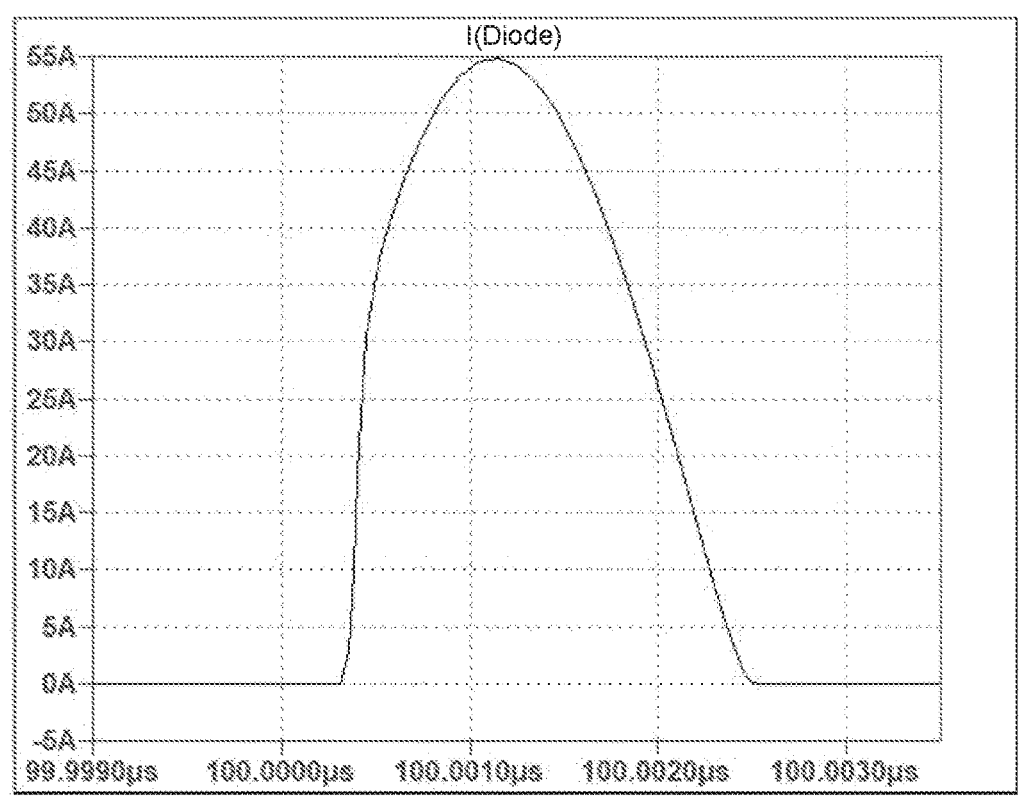
FIG. 27 is a diagram illustrating a current pulse of the driver circuit in the related art as shown in FIG. 1.
Figure 28:
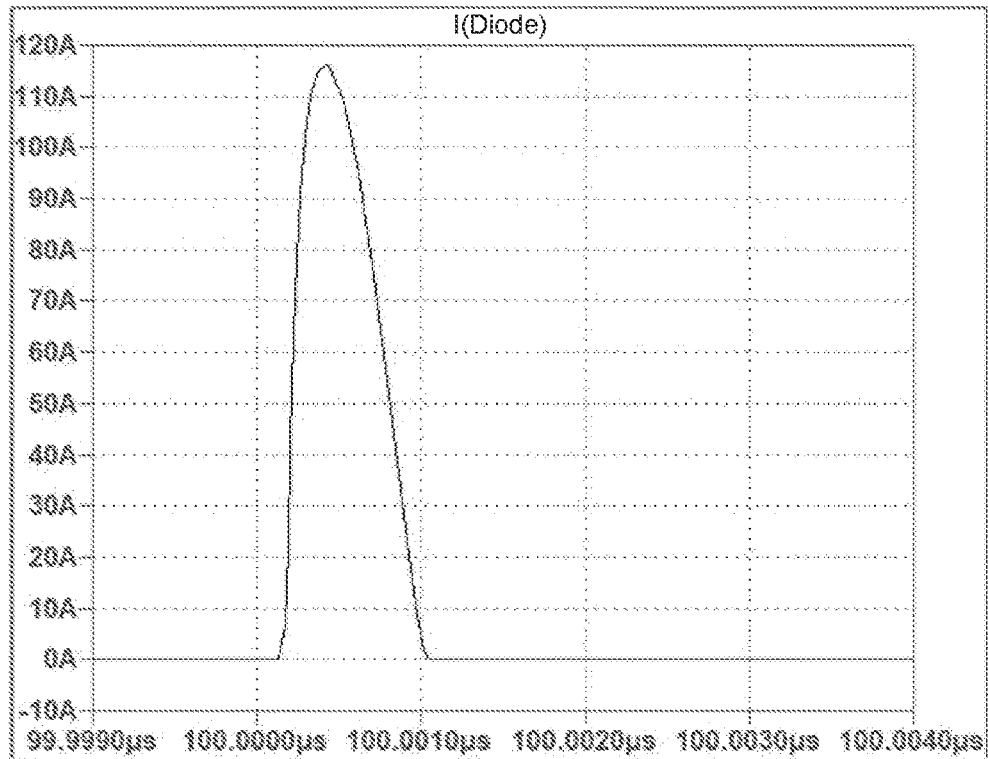
FIG. 28 is a diagram illustrating a current pulse of a driver circuit according to embodiments of the present application.

Exemplarily, an example is taken in which the semiconductor light source is a light-emitting diode. FIG. 27 is a diagram illustrating a current pulse of the driver circuit in the related art as shown in FIG. 1. FIG. 28 is a diagram illustrating a current pulse of a driver circuit according to embodiments of the present application. An abscissa represents time. An ordinate represents a current. Comparing FIGS. 27 and 28, it can be seen that the semiconductor light source 100 provided in embodiments of the present application is integrated with the capacitor. Therefore, the pulse width of the current is reduced significantly, thereby significantly improving optical power and also improving the performance of the driver circuit. Additionally, it can be obtained by calculation that the series inductance between the capacitor and the semiconductor light source is about 0.6 nH in the driver circuit in the related art. In the present application, since the semiconductor light source is integrated with the capacitor, the series inductance of the capacitor and the semiconductor light source is reduced significantly and is about 0.1 nH.

Above all, for the semiconductor light source integrated with the capacitor provided in embodiments of the present application, the series inductance between the semiconductor light source and the capacitor is reduced significantly, thereby implementing relatively short optical pulse width and relatively large optical power, improving the performance of the dToF driver circuit, and simplifying the design of the driver circuit with no need of a complicated packaging manner.

What is claimed is:

1. A semiconductor light source, comprising:
an active layer;
a first semiconductor layer and a second semiconductor layer, wherein the first semiconductor layer and the second semiconductor layer are located on two opposite sides of the active layer; and
a first electrode, a second electrode, and a third electrode, wherein the first electrode is in ohmic contact with the first semiconductor layer, the third electrode is in ohmic contact with the second semiconductor layer, and a first dielectric layer is disposed between the first electrode and the second electrode,
wherein the first semiconductor layer is a p-type semiconductor layer, and the second semiconductor layer is an n-type semiconductor layer; or the first semiconductor layer is an n-type semiconductor layer, and the second semiconductor layer is a p-type semiconductor layer;
wherein an orthographic projection of the first electrode on a plane where the active layer is located does not overlap an orthographic projection of the second electrode on the plane where the active layer is located, an orthographic projection of the first electrode on a first plane overlaps an orthographic projection of the second electrode on the first plane, and the first plane intersects the plane where the active layer is located; and
wherein a shape of a projection of the first dielectric layer on the plane where the active layer is located comprises a zigzag shape or a spiral shape; and the first electrode and the second electrode are located on two opposite sides of the first dielectric layer.

2. The semiconductor light source according to claim 1, wherein the first semiconductor layer comprises at least two first sub-semiconductor layers with different materials; and the second semiconductor layer comprises at least two second sub-semiconductor layers with different materials.

3. The semiconductor light source according to claim 1, wherein a material of the first dielectric layer comprises at least one of air, silicon dioxide, silicon nitride, aluminum oxide, titanium dioxide, tantalum oxide, hafnium oxide, or a polymer.

4. The semiconductor light source according to claim 1, wherein an orthographic projection of the second electrode on a plane where the active layer is located does not overlap an orthographic projection of the third electrode on the plane where the active layer is located;

wherein the orthographic projection of the second electrode on the plane where the active layer is located does not overlap an orthographic projection of the second semiconductor layer on the plane where the active layer is located.

5. The semiconductor light source according to claim 1, wherein an orthographic projection of the first electrode on a plane where the active layer is located overlaps an orthographic projection of the second electrode on the plane where the active layer is located;

wherein the first dielectric layer comprises at least two first sub-dielectric layers and at least one second sub-dielectric layer, the at least two first sub-dielectric layers are parallel to the plane where the active layer is located, and one of the at least one second sub-dielectric layer is located on a same side of two adjacent first sub-dielectric layers of the at least two first sub-dielectric layers and connects with the two adjacent first sub-dielectric layers; and the first electrode and the second electrode are located on two opposite sides of a same first sub-dielectric layer of the at least two first sub-dielectric layers and located on two opposite sides of a same second sub-dielectric layer of the at least one second sub-dielectric layer.

6. The semiconductor light source according to claim 1, wherein the second electrode is located on a side of the first electrode facing the second semiconductor layer; and a second dielectric layer is disposed on a side of the second electrode facing away from the first electrode.

7. The semiconductor light source according to claim 6, wherein the second dielectric layer comprises a first dielectric portion, a second dielectric portion, a third dielectric portion, and a fourth dielectric portion;

an orthographic projection of the first electrode on a plane where the active layer is located and an orthographic projection of the first dielectric layer on the plane where the active layer is located each overlap an orthographic projection of the first dielectric portion on the plane where the active layer is located, and the orthographic projection of the first dielectric portion on the plane where the active layer is located does not overlap an orthographic projection of the second electrode on the plane where the active layer is located;

the orthographic projection of the first electrode on the plane where the active layer is located, the orthographic projection of the first dielectric layer on the plane where the active layer is located, and the orthographic projection of the second electrode on the plane where the active layer is located each overlap an orthographic projection of the second dielectric portion on the plane where the active layer is located;

the orthographic projection of the second electrode on the plane where the active layer is located overlaps an orthographic projection of the third dielectric portion on the plane where the active layer is located; and the orthographic projection of the third dielectric portion on the plane where the active layer is located overlaps neither the orthographic projection of the first electrode on the plane where the active layer is located nor the orthographic projection of the first dielectric layer on the plane where the active layer is located;

the orthographic projection of the first dielectric layer on the plane where the active layer is located and the orthographic projection of the second electrode on the plane where the active layer is located each overlap an orthographic projection of the fourth dielectric portion on the plane where the active layer is located, and the orthographic projection of the fourth dielectric portion on the plane where the active layer is located does not overlap the orthographic projection of the first electrode on the plane where the active layer is located; and in a direction perpendicular to the plane where the active layer is located, a thickness of the first dielectric portion is greater than a thickness of the second dielectric portion, and a thickness of the third dielectric portion is greater than or equal to the thickness of the second dielectric portion.

8. The semiconductor light source according to claim 1, wherein the second electrode is located on a side of the first electrode facing away from the second semiconductor layer; and a second dielectric layer is disposed on a side of the first electrode facing away from the second electrode.

9. The semiconductor light source according to claim 8, wherein the second dielectric layer comprises a fifth dielectric portion, a sixth dielectric portion, and a seventh dielectric portion;

an orthographic projection of the first electrode on a plane where the active layer is located overlaps an orthographic projection of the fifth dielectric portion on the plane where the active layer is located, and the orthographic projection of the fifth dielectric portion on the plane where the active layer is located overlaps neither an orthographic projection of the first dielectric layer on the plane where the active layer is located nor an orthographic projection of the second electrode on the plane where the active layer is located;

the orthographic projection of the first electrode on the plane where the active layer is located and the orthographic projection of the first dielectric layer on the plane where the active layer is located each overlap an orthographic projection of the sixth dielectric portion on the plane where the active layer is located, and the orthographic projection of the sixth dielectric portion on the plane where the active layer is located does not overlap the orthographic projection of the second electrode on the plane where the active layer is located;

the orthographic projection of the first electrode on the plane where the active layer is located, the orthographic projection of the first dielectric layer on the plane where the active layer is located, and the orthographic projection of the second electrode on the plane where the active layer is located each overlap an orthographic projection of the seventh dielectric portion on the plane where the active layer is located; and in a direction perpendicular to the plane where the active layer is located, a thickness of the seventh dielectric portion is greater than or equal to a thickness of the sixth dielectric portion.

10. The semiconductor light source according to claim 1, wherein in a direction perpendicular to a plane where the active layer is located, the semiconductor light source comprises a plurality of active layers; and two adjacent active layers of the plurality of active layers are connected through a tunnel junction.

11. The semiconductor light source according to claim 1, wherein the semiconductor light source comprises one emitter; or the semiconductor light source comprises a plurality of emitters arranged in an array, a passivation layer and a dielectric layer are disposed between adjacent emitters of the plurality of emitters, and the dielectric layer comprises at least the first dielectric layer.

12. The semiconductor light source according to claim 1, wherein the semiconductor light source is a vertical-cavity surface-emitting laser; and the first semiconductor layer comprises a first distributed Bragg reflector, and the second semiconductor layer comprises a second distributed Bragg reflector.

13. The semiconductor light source according to claim 12, further comprising a substrate, wherein the first semiconductor layer is located on a side of the second semiconductor layer facing away from the substrate; and the semiconductor light source emits a light beam in a direction of the substrate pointing to the active layer, or the semiconductor light source emits a light beam in a direction of the active layer pointing to the substrate.

14. The semiconductor light source according to claim 1, wherein the semiconductor light source is a light-emitting diode or an edge-emitting laser diode.

15. The semiconductor light source according to claim 14, wherein in a case where the semiconductor light source is a light-emitting diode, the first semiconductor layer is located on a light emission side of the light-emitting diode, a transparent electrode is disposed on a side of the first semiconductor layer facing away from the active layer, the transparent electrode is in ohmic contact with the first semiconductor layer, and the first electrode is in contact with the transparent electrode.

16. The semiconductor light source according to claim 14, wherein in a case where the semiconductor light source is an edge-emitting laser diode, the second electrode is located on a side of the first electrode facing the active layer; and a second dielectric layer and the first semiconductor layer that are stacked are comprised between the second electrode and the active layer, and the first semiconductor layer is located on a side of the second dielectric layer facing away from the second electrode.

17. A driver circuit of a semiconductor light source, configured to drive the semiconductor light source according to claim 1 and comprising a first voltage source, a second voltage source, a charging resistor, a field-effect transistor, and a control signal source, wherein a voltage of the first voltage source is greater than a voltage of the second voltage source;

a first pole of the field-effect transistor is electrically connected to the third electrode of the semiconductor light source; a second pole of the field-effect transistor is electrically connected to the second electrode of the semiconductor light source through a first node; a gate of the field-effect transistor is electrically connected to the control signal source; the first pole is a drain of the field-effect transistor, and the second pole is a source of the field-effect transistor; or the first pole is a source of the field-effect transistor, and the second pole is a drain of the field-effect transistor;

the first voltage source is electrically connected with a positive electrode in the semiconductor light source, the second voltage source is electrically connected with a negative electrode in the semiconductor light source, the positive electrode is an electrode that is in ohmic contact with the p-type semiconductor layer in the semiconductor light source, and the negative electrode is an electrode that is in ohmic contact with the n-type semiconductor layer in the semiconductor light source; and the charging resistor is connected in series in a loop composed of the first voltage source, the first electrode, the second electrode, and the second voltage source.

18. The driver circuit according to claim 17, wherein the first semiconductor layer is the p-type semiconductor layer, the first electrode is the positive electrode, the second semiconductor layer is the n-type semiconductor layer, and the third electrode is the positive electrode; and a first end of the charging resistor is electrically connected to the first voltage source, a second end of the charging resistor is electrically connected to the first electrode of the semiconductor light source, and the first node is electrically connected to the second voltage source.

19. The driver circuit according to claim 17, wherein the first semiconductor layer is the n-type semiconductor layer, the first electrode is the negative electrode, the second semiconductor layer is the p-type semiconductor layer, and the third electrode is the positive electrode; and a first end of the charging resistor is electrically connected to the second voltage source, a second end of the charging resistor is electrically connected to the first electrode of the semiconductor light source, and the first node is electrically connected to the first voltage source.

20. The driver circuit according to claim 17, wherein the voltage of the first voltage source is greater than 0 V, and the second voltage source is grounded.

* * * * *